US006630283B1

(12) United States Patent
Simpson et al.

(10) Patent No.: US 6,630,283 B1
(45) Date of Patent: Oct. 7, 2003

(54) PHOTOTHERMOGRAPHIC AND PHOTOGRAPHIC ELEMENTS HAVING A TRANSPARENT SUPPORT HAVING ANTIHALATION PROPERTIES AND PROPERTIES FOR REDUCING WOODGRAIN

(75) Inventors: Sharon M. Simpson, Lake Elmo, MN (US); Michael F. Weber, Shoreview, MN (US); Nicholas A. Stacey, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 178 days.

(21) Appl. No.: 09/656,930

(22) Filed: Sep. 7, 2000

(51) Int. Cl.[7] .................................................. G03F 7/11

(52) U.S. Cl. .................... 430/271.1; 430/533; 430/510; 430/534; 430/536; 430/523

(58) Field of Search ............................. 430/271.1, 533, 430/510, 534, 536, 523

(56) References Cited

U.S. PATENT DOCUMENTS

| | | | |
|---|---|---|---|
| 2,422,008 A | 6/1947 | Glassy | 95/8 |
| 2,481,770 A | 2/1949 | Nadeau | 95/9 |
| 3,801,429 A | 4/1974 | Schrenk | 161/181 |
| 4,312,941 A | 1/1982 | Scharf | 430/510 |
| 4,581,323 A | 4/1986 | Fisher | 430/513 |
| 5,094,788 A | 3/1992 | Schrenk | 264/171 |
| 5,094,793 A | 3/1992 | Schrenk | 264/171 |
| 5,233,465 A | 8/1993 | Wheatley | 428/30 |
| RE34,605 E | 5/1994 | Schrenk | 359/359 |
| 5,360,659 A | 11/1994 | Arends | 428/216 |
| 5,434,043 A | 7/1995 | Zou | 430/619 |
| 5,460,938 A | 10/1995 | Kirk | 430/619 |
| 5,506,704 A | 4/1996 | Broer | 359/65 |
| 5,541,054 A | 7/1996 | Miller | 430/572 |
| 5,545,515 A | 8/1996 | Murray | 430/617 |
| 5,559,634 A | 9/1996 | Weber | 359/638 |
| 5,686,979 A | 11/1997 | Weber | 359/40 |

(List continued on next page.)

FOREIGN PATENT DOCUMENTS

| | | | |
|---|---|---|---|
| DE | 19745647 A1 | 10/1997 | |
| EP | 0600589 A2 | 9/1999 | |
| WO | WO95/17303 | 12/1993 | |
| WO | WO96/19347 | 12/1994 | |
| WO | WO 96/15479-a1 | * 5/1996 | G03C/1/498 |

OTHER PUBLICATIONS

Grant et al , "polyvinyl" "p.chain", p. 464 of Grant and Hackh's Chemical Dictionary, fifth ed, McGraw–Hill Book Company, New York, N.Y., 1987.*

(List continued on next page.)

*Primary Examiner*—Cynthia Hamilton

(57) ABSTRACT

A photosensitive element includes a layer of a photosensitive material on a transparent, multilayer, polymeric support having numerous alternating layers of at least two different polymeric materials. The polymeric multilayer support reflects at least 50% of actinic radiation in the range of wavelengths to which the photosensitive material is sensitive. If the polymeric multilayer reflector includes numerous, thin, alternating layers located at the surface of the polymeric support closest to the photosensitive material, the element not only provides increased speed but also provides an antihalation effect. In another aspect, a multilayer reflector is located a distance removed from the photosensitive layer sufficient to reduce any woodgrain that would otherwise occur, while increasing speed.

58 Claims, 8 Drawing Sheets

U.S. PATENT DOCUMENTS

| | | | | |
|---|---|---|---|---|
| 5,691,789 | A | 11/1997 | Li | 349/98 |
| 5,783,120 | A | 7/1998 | Ouderkirk | 264/1.34 |
| 5,793,456 | A | 8/1998 | Broer | 349/98 |
| 5,795,708 | A | 8/1998 | Boutet | 430/617 |
| 5,808,794 | A | 9/1998 | Weber | 359/487 |
| 5,808,798 | A | 9/1998 | Weber | 359/583 |
| 5,825,542 | A | 10/1998 | Cobb, Jr. | 359/487 |
| 5,825,543 | A | 10/1998 | Ouderkirk | 359/495 |
| 5,858,448 | A | 1/1999 | Sakata | 426/656 |
| 5,858,624 | A | 1/1999 | Chou | 430/371 |
| 5,867,316 | A | 2/1999 | Carlson | 359/500 |
| 5,882,774 | A | 3/1999 | Jonza et al. | 428/212 |
| 6,020,116 | A | 2/2000 | Camp | 430/536 |
| 6,071,680 | A | 6/2000 | Bourdelais | 430/496 |

OTHER PUBLICATIONS

U.S. patent application Ser. No. 09/232,332, filed Jan. 15, 1999, Hebrink.

U.S. patent application Ser. No. 09/399,521, filed Sep. 20, 1999, Nevitt.

U.S. patent application Ser. No. 09/444,756, filed Nov. 22, 1999, 3M Innovative.

U.S. patent application Ser. No. 09/229,724, Nov. 13, 1998, Neavin.

* cited by examiner

PHOTOTHERMOGRAPHIC AND PHOTOGRAPHIC ELEMENTS HAVING A TRANSPARENT SUPPORT HAVING ANTIHALATION PROPERTIES AND PROPERTIES FOR REDUCING WOODGRAIN

FIELD OF THE INVENTION

This invention relates to photosensitive elements and particularly to photographic, photothermographic, and polymeric elements made with multilayer polymeric supports.

BACKGROUND OF THE INVENTION

Light-sensitive recording materials, such as photographic and photothermographic elements, frequently suffer from a phenomenon known as halation which causes degradation in the quality of the recorded image. These light sensitive recording materials typically comprise a photosensitive layer and a support (also known as a substrate or film base). Image quality degradation occurs when a fraction of the imaging light which strikes the photosensitive layer is not absorbed, but instead passes through to the support on which the photosensitive layer is coated, and a portion of the light reaching the support is reflected back to strike the photosensitive layer in a different area. This reflected light may, in some cases, contribute significantly to the total exposure of the photosensitive layer. However, such increased exposure (speed) can occur at the expense of sharpness.

Any particulate matter, including silver halide grains, in the photosensitive element may cause light passing through the element to be scattered. Scattered light which is reflected from the support will, on its second passage through the photosensitive layer, cause exposure over an area adjacent to the point of intended exposure. This effect leads to reduced image sharpness and image degradation. Silver-halide containing photosensitive materials, including photographic and photothermographic elements, are particularly prone to this form of image degradation since the photosensitive layers contain light-scattering particles (see, T. N. James, *The Theory of the Photographic Process*, 4th Edition, Chapter 20, Macmillan 1997).

In order to improve the image sharpness of photographic and photothermographic elements, it is customary to incorporate into one or more layers of the material a dye which absorbs light that has been scattered within the coating and would otherwise lead to reduced image sharpness. To be effective, the absorption of this dye must be at about the same wavelength as the sensitivity of the photosensitive layer.

In the case of imaging materials coated on a transparent support, a light absorbing layer is frequently coated in a separate backing layer or underlayer on the reverse side of the support from the photosensitive layer. Such a coating, known as an "antihalation layer," effectively reduces reflection of light which has passed through the photosensitive layer. A similar effect may be achieved by interposing a light absorbing layer between the photosensitive layer and the support. This construction, known in the art as an "antihalation underlayer" is applicable to photosensitive coatings on non-transparent as well as on transparent supports.

A light absorbing substance may be incorporated into the photosensitive layer itself to absorb scattered light. Substances used for this purpose are known as "acutance dyes." These dyes should not cause fogging of the silver in the imaging layer. It is also possible to improve image quality by coating a light absorbing layer above the photosensitive layer of a photographic element. Coatings of this kind, described in U.S. Pat. Nos. 4,581,323 and 4,312,941 prevent multiple reflections of scattered light between the internal surfaces of a photographic element.

Use of a reflective support is known to be one method of increasing film speed. However, reflective supports may not reduce halation, are generally opaque, and do not allow for viewing the image using back lighting.

U.S. Pat. No. 5,795,708 describes the use of a dichroic mirror antihalation layer to increase speed and improve sharpness for heat processable films. The continuous dichroic mirror layer is formed from multilayers of alternating layers of silicon dioxide and titanium dioxide and is coated on top of a base layer (i.e. a support).

Multilayer polymeric stacks have also been disclosed that function as wavelength selective reflectors such as "cold mirrors" that reflect visible light but transmit infrared or "hot mirrors" that transmit visible and reflect infrared. Examples of a wide variety of multilayer stacks that may be constructed are included in U.S. Pat. No. 5,882,774 entitled "Optical Film." U.S. Pat. No. 5,882,774 is incorporated herein by reference.

An additional problem occurs when a high quality photothermographic or photographic medium is exposed by coherent radiation (e.g. as in a laser imaging system) at a uniform exposure level across the entire surface of the sheet. This problem, termed "woodgrain" is a spurious pattern that bears a remarkable resemblance to the pattern of grain in wood, hence the name. These patterns tend to be neither symmetrical nor repetitive, and, like the grain in polished wood, appear as variations in the optical density (i.e. lightness and darkness) on the image surface. Such spurious image patterns are, of course, undesirable in any imaging system where the quality of the image is critical.

Typically, one source of woodgrain is an interference pattern set up within the photosensitive layer by light reflecting from its upper and lower surfaces. The lower surface of said layer may be weakly reflecting but it can reflect enough light to cause problems in some cases. For example, with a polyester support, the index of refraction is about 1.65 while a silver halide photographic emulsion coating has an index of about 1.5. This index differential is enough to cause some woodgrain. If a reflector is placed at this bottom interface, much more light is reflected and this may enhance the woodgrain effect.

The interference pattern that is created by light reflected from the upper and lower surfaces of the photosensitive layer is a map of the thickness of said layer. Polymer films and coatings generally can be controlled in thickness to within a few percent. One percent of a thick film is much greater than one percent of a thin film. Therefore, for typical film or coating variations, when the interfering waves originate from the surfaces of thick films, the interference fringes occur much closer together than for surfaces of thin films. The thicker the films, the closer the interference fringes until they eventually merge, i.e. they dissappear. Interfering rays from the two surfaces can be either constructive or destructive, depending on the separation distance of the two surfaces. The standing wave pattern induced by this situation causes a higher absorption of light in areas where constructive interference occurs. Since the difference between the constructive or destructive interference condition is only ½ wave, or about 200 nm for 633 nm light within material of index 1.5, any small variation in thickness can change the interference condition from constructive to destructive, that is, from enhanced light intensity to decreased light intensity. The thickness of a typical coating may vary by several ½ waves over a short lateral distance, giving rise to several high and low intensity exposure bands, or fringes, over said distance. Polymer films and coatings generally can be controlled in thickness to within a few percent. One percent of a thick film is much greater than one percent of a thin film. Therefore, for typical film or coating variations, when the interfering waves originate from the surfaces of thick films, the interference fringes occur much closer together than for surfaces of thin films. The thicker the films, the closer the interference fringes until they eventually merge, i.e. they dissappear.

SUMMARY OF THE INVENTION

The present invention is a photosensitive element comprising a layer of a photosensitive material on a transparent, multilayer, polymeric support. The photosensitive material is sensitive to actinic radiation of certain wavelengths. The multilayer polymeric support comprises numerous alternating layers of at least two different polymeric materials. The multilayer polymeric support preferably reflects at least 50% of actinic radiation in the range of wavelengths to which the photosensitive material is sensitive. This photosensitive structure has increased speed over standard photosensitive structures coated on polymeric supports.

Preferably, the photosensitive element is a photographic element or a photothermographic element. The multilayer polymeric support is preferably transparent when viewed by the human eye. The multilayer polymeric support may have a relatively thick intermediate film layer and numerous thin alternating layers of two or more different polymeric materials. If the numerous, thin, alternating layers are located at the surface of the polymeric support closest to the photosensitive layer, the support not only provides increased speed but also provides an antihalation effect.

In another aspect of the present invention, a multilayer reflector is located a distance removed from the photosensitive layer sufficient to reduce any woodgrain that would otherwise occur, while increasing speed. The multilayer film may be placed on the bottom side of the support. Typically, the support is rather thick, on the order of 0.005 inches or more (0.125 mm or more), so the multilayer reflector may alternatively be placed in the center of the support. Alternatively, the multilayer reflector may itself serve as the support. The reflector itself could be 0.01 mm, or thinner, depending on the indices of refraction of the materials comprising the reflector.

DETAILED DESCRIPTION OF THE INVENTION

One aspect of the present invention is a support for light sensitive recording materials comprising a polymeric reflector having a periodically varying index of refraction. Such a reflector is often referred to as a dielectric mirror. The purpose of the reflector is to provide an enhanced speed to the film without the need for changing the photosensitive layer, or conversely, reducing the amount of photosensitive material while maintaining a given speed. The speed of the film is directly related to the amount of light absorbed in the photosensitive layer. Since many photosensitive layers only absorb a small fraction of the incident light, a support which returns the incident light for a second pass through the photosensitive layer or layers will effectively double the amount of light absorbed. A dielectric mirror can provide such an effect, while still acting as a transparent support, if the exposing radiation is outside of the visible range or consists only of a narrow band of visible wavelengths.

Figure 7:
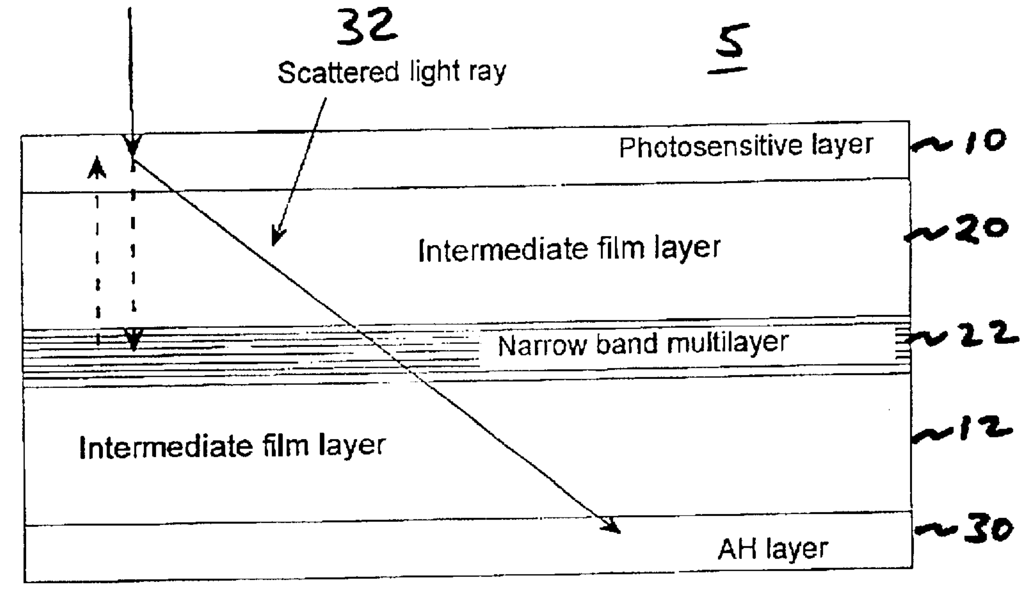
FIG. 7 shows a schematic of yet another exemplary film layer structure as contemplated by the invention.

Another aspect of the present invention is locating a multilayer reflector a distance removed from the photosensitive layer sufficient to reduce any woodgrain that would otherwise occur. The multilayer reflector may be placed on the bottom side of the support. Typically, the support is rather thick, on the order of 0.005 inches or more (0.125 mm or more), so the multilayer reflector may alternatively be placed in the center of the support. Alternatively, the multilayer reflector may itself serve as the support. The reflector itself could be 0.01 mm, or thinner, depending on the refractive indices of the materials comprising the reflector. It may be preferable to place the reflector near the center of the support for both process and structural reasons. Placement of the reflector at a distal position with respect to the photosensitive layer will not affect the typical woodgrain that occurs from the two surfaces of the the photosensitive layer itself. That source of woodgrain must be dealt with by additional techniques. During multilayer coextrusion a protective boundary layer or skin layer is typically needed on the outside surfaces of the multilayer in order to prevent turbulant flow of the layers due to shearing action near the walls of the extrusion equipment such as the die. A thick skin layer of PEN or PET may advantageously serve dual purposes as both skin layer and intermediate film layer. In order to prevent curl or warping of the composite support with temperature or humidity, it may be preferable to utilize a symmetrical construction wherein the opposing skin layers are of approximately equal thickness as illustrated in FIG. 7 which also indicates a thin reflector for narrow band multilayer reflector 22. Alternatively, for some applications, the opposing skin layers may have unequal thicknesses. If semicrystalline polymers are utilized for both the optical layers and the skin layers, they must be chosen such that the common orientation conditions will impart the needed optical and physical properties to each. The simplest case is to use the same polymer, such as, for example, PET for both the skin layers and the high index optical layers. Alternatively, PEN may be used for both types of layers.

In contrast to the present invention, the dichroic mirror of U.S. Pat. No. 5,795,708 cannot be placed in the center of a PET film base because a vapor deposited film can only be placed on a surface. Although this surface could be laminated to another with a clear optical adhesive, this adds greatly to the manufacturing cost of the support. On the other hand, the coextruded reflector and intermediate film layers of this invention, that utilize a common resin for both the skins and one of the optical layers, and that are manufactured in large volumes, would be much lower in cost than a laminated film that includes a multilayer vapor deposited mirror.

FIG. 7 shows one example of a film layer structure as contemplated by the invention for reducing woodgrain. Shown in FIG. 7 is a photosensitive element including a photosensitive layer 10, a first intermediate film layer 20, a narrow band multilayer reflector 22, a second intermediate film layer 12 and an antihalation layer 30. Examples incorporating a structure similar to FIG. 7, but where the first and second intermediate layers 12 and 20 have unequal thicknesses, are described in more detail below with reference to Examples 16–21.

Depending upon the application, the film layer structure comprises a co-extruded support including intermediate film layers 12 and 20 and narrow band multilayer reflector 22. In an alternate embodiment the support can comprise one of the intermediate film layers 12 or 20 in combination with narrow band multilayer reflector 22. In yet another alternate embodiment, the support can comprise only the narrow band multilayer reflector 22. The number of layers in the narrow band reflector can be selected to adjust the thickness of the support. A narrow band reflector is a reflector where the majority or all of the layer pairs have approximately the same optical thickness and are tuned to reflect the activating wavelength at a selected angle of incidence.

The narrow band multilayer reflector 22 in FIG. 7 has layers tuned only to wavelengths near the exposing wavelength at the intended exposure angle. If the exposing radiation will be incident from a variety of angles, then additional layers must be added that are tuned to that wavelength for those angles. Such a reflector is referred to herein as a wide angle reflector. Basically, a layer pair thickness (d) is tuned by angle according to the well known formula, $\frac{1}{2}\lambda = nd \cos\theta$, where $\lambda$ is the wavelength, $\theta$ is the average angle of propogation in the multilayer stack, and n is the average index of refraction. The higher the angle, the thicker a layer must be to reflect light of a given wavelength. Note that a scattered light ray 32 is shown passing through the multilayer reflector 22. One way to prevent such a ray from reflecting off the bottom surface of the support, is to add a light absorbing layer like, for example, antihalation layer 30.

In another aspect of the present invention, the scattered rays that cause halation may be reflected by using additional reflector layers tuned to reflect rays at appropriate angles placed closer to the photosensitive layer. Thus the need for an antihalation layer is substantially reduced or even eliminated in some cases. To prevent the long distance lateral travel of the rays which are scattered at the highest angles, it would be advantageous to place the thickest reflector layers closest to the photosensitve layer. Rays scattered at very high angles will be attenuated by absorption within the photosensitve layer itself.

Figure 4:
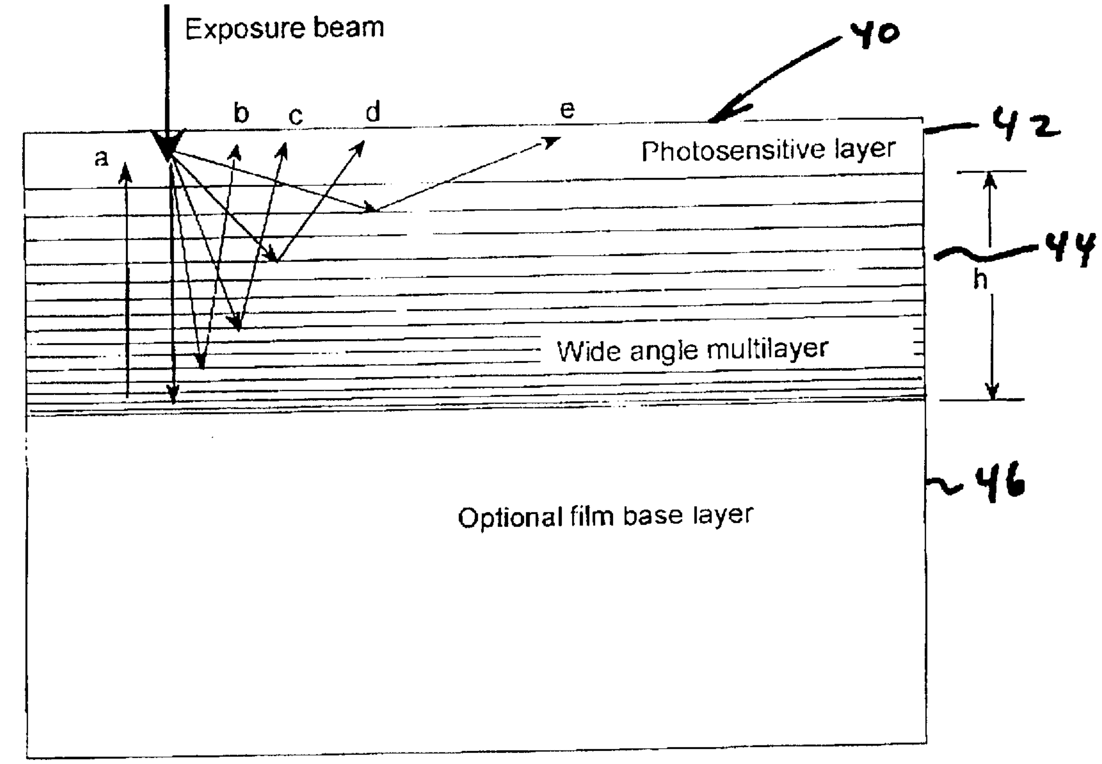
FIG. 4 shows a schematic of another exemplary film layer structure as contemplated by the invention.

Referring now to FIG. 4, a support with a wide angle reflector is illustrated. The support 40 includes a photosensitive layer 42, a multilayer reflector 44 and an optional intermediate film layer 46. Only a small portion of rays are scattered at high angles, and the problem with woodgrain is much less serious with such rays. As such, layers designed to reflect these rays can be placed much closer to the photosensitve layer. Rays scattered at progressively smaller angles can be reflected from deeper within the support while still reducing the lateral travel of such rays. The preferred multilayer stack, or support, 44 may advantageously be optimized according to such an angle vs. lateral distance scheme. Optical layers may be added so that the correct spacing for depth vs. angle of reflectivity is obtained for all parts of the multilayer reflector.

Alternatively, since it may be necessary to restrict the total number of layers because of manufacturing considerations, thicker intermediate film layers may be used to separate portions of the reflector layers to the proper depths. Such layers could also be strategically placed and chosen for physical properties to provide a balanced film construction that will not warp with changes in temperature and humidity. Again, such a construction is not feasible when a vapor deposited multilayer reflector is used to reflect the exposing radiation.

Figure 1:
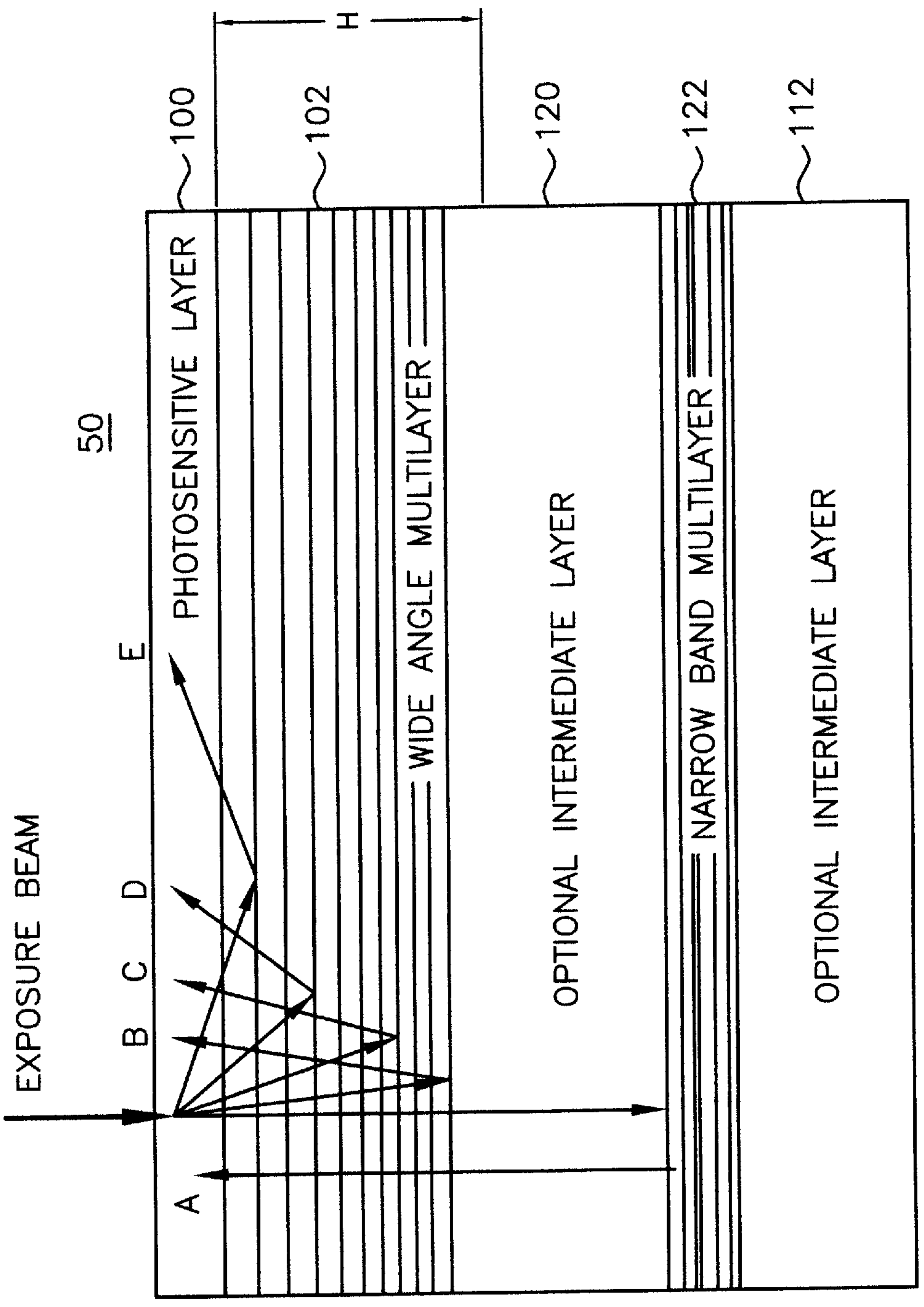
FIG. 1 shows a schematic of an exemplary film layer structure as contemplated by the invention.

Referring now to FIG. 1, a schematic of an exemplary film layer structure as contemplated by the invention including features as described in relation to FIG. 7 and FIG. 4 to alleviate both woodgrain and halation effects. The film layer structure 50 includes a photosensitive layer 100, a wide angle multilayer reflector 102, a first intermediate film layer 120, a narrow band multilayer reflector 122, and a second intermediate film layer 112. The combination of novel features substantially eliminates the need for an antihalation layer, while also substantially reducing woodgrain. It will be understood that the film layer structure includes a support that may optionally include only the wide angle multilayer support 102 or the narrow band multilayer reflector 122. Alternately, the support may comprise all of the elements of FIG. 1 and can include one or more intermediate film layers.

The Multilayer Reflector

Although generally any reflective element will work to increase the speed of the photosensitive layer, a preferred reflective element is a polymeric multilayer reflector that specularly reflects incident activating radiation at a selected angle of incidence or over a wide range of angles. As used herein, polymeric multilayer reflectors include multilayer optical films having alternating polymeric layers with differing indices of refraction, as well as multiple pitch cholesteric liquid crystal films; both types of reflectors have a periodic variation in index of refraction in the thickness direction orthogonal to the plane of the film.

Alternatively, if it is desired to reflect a narrow range of wavelengths over a narrow range of angles, a single pitch cholesteric film may be used. Typically, two cholesteric film layers having opposite chiralty are combined to make a mirror that reflects both planes of polarization as described in German patent publication DE 197 45 647 A1. Suitable cholesteric reflective layers are described in, for example, U.S. Pat. No. 5,793,456, U.S. Pat. No. 5,506,704, and U.S. Pat. No. 5,691,789. For many applications, the cholesteric film is optionally combined with a quarter wave retarder.

The polymeric multilayer reflector of the present invention is preferably a dielectric optical film having alternating layers of a first polymer having a high index of refraction and a second polymer having a low index of refraction which interact to reflect at least 50% of the incident activating radiation at a selected incidence angle. The in-plane indices of refraction of the first and second polymers should differ by at least 0.03. Suitable isotropic multilayer reflectors that are designed to reflect in the infrared region of the spectrum are described, for example, in U.S. Pat. Nos. RE 34,605; 5,233,465; and 5,360,659, all of which are herein incorporated by reference. To maintain maximum visible transmission, layer design techniques can be used which reduce higher order overtones that reflect in the visible region of the spectrum. For example, U.S. Pat. No. RE 34,605 describes an all polymeric three-component optical interference film formed by coextrusion techniques which reflects infrared light while suppressing second, third and fourth order reflections in the visible region of the spectrum. U.S. Pat. No. 5,360,659 describes an all polymeric two-component film which can also be coextruded and reflects infrared light while suppressing second, third, and fourth order wavelengths that occur in the visible portion of the spectrum. The film comprises alternating layers of first (A) and second (B) diverse polymeric materials having a six layer alternating repeat unit with relative optical thicknesses of about 7:1:1.

While the dielectric optical film may be isotropic or birefringent, the multilayer reflector of the present invention is preferably a birefringent polymeric multilayer film, and more preferably, the birefringent polymeric multilayer reflector is designed so that the efficiency of reflectance of p polarized light can be controlled with angle. Such films are described in detail below.

The preferred multilayer polymeric supports of this invention are preferably preselected such that they are tuned to reflect radiation of the wavelength to which the photosensitive material is sensitized (activating wavelengths). Preferably, the supports reflect at least 50% of the radiation of activating wavelengths, more preferably the support reflects at least 75%, and even more preferably 90% of the radiation of activating wavelengths. The types and concepts of reflective multilayer polymeric supports suitable for this invention are generally described in U.S. Pat. No. 5,882,774, entitled "Optical Film", incorporated herein by reference. Specific materials and constructions must be designed to match with the photosensitive material and ultimate use.

In one aspect of the present invention, halation is substantially reduced by placing the thickest reflector layers near the top of the multilayer stack to reflect all off angle exposures near the interface between the photosensitive layer and the multilayer stack. However, if scattered off angle rays pass through the reflector, then some halation will occur. An added antihalation layer absorbs these rays to further improve sharpness. In addition, use of a wide angle reflector will cause the photosensitive layer to exhibit additional speed since a large percent of the rays will be reflected as shown in FIG. 4.

Preferred multilayer optical films as used in conjunction with the present invention exhibit relatively low absorption of incident light, as well as high reflectivity for both s and p polarized light at all angles of incidence.

Multilayer reflectors of the present invention exhibit a Brewster angle (the angle at which reflectance goes to zero for light incident at any of the layer interfaces) which is very large or is nonexistent for the polymer layer interfaces. As a result, multilayer stacks having high reflectivity for both s and p polarized light over a wide bandwidth, and over a wide range of angles can be achieved. For some aspects of the invention, reflectivity of p polarized light at high angles of incidence is desirable, and this cannot be done with isotropic material stacks.

In a typical multilayer stack comprising alternating layers of differing materials, 1 and 2, the indices of refraction, along orthogonal directions x, y, and z for each layer, are n1x, n1y, and n1z for one layer, and n2x, n2y, and n2z for the alternating layer. The relationships between the indices of refraction in each film layer to each other and to those of the other layers in the film stack determine the reflectance behavior of the multilayer stack at any angle of incidence, from any azimuthal direction. The principles and design considerations described in U.S. Pat. No. 5,882,774, entitled "Optical Film," can be applied to create multilayer stacks having the desired optical effects for a wide variety of circumstances and applications. The indices of refraction of the layers in the multilayer stack can be manipulated and tailored to produce the desired optical properties. Additional useful information on optical film is published in the article "Giant Birefringent Optics in Multilayer Polymer Mirrors", by Michael F. Weber, Carl A. Stover, Larry R. Gilbert, Timothy J. Nevitt, and Andrew J. Ouderkirk; Science, vol. 287, Mar. 31, 2000, pp. 2451–2456.

A multilayer stack can include tens, hundreds, or thousands of layers, and each layer can be made from any of a number of different materials. The characteristics that determine the choice of materials for a particular stack depend upon the desired optical performance of the stack. The stack can contain as many materials as there are layers in the stack. For ease of manufacture, preferred optical thin film stacks contain only a few different materials.

The preferred multilayer stack is comprised of low/high refractive index pairs of film layers, wherein each low/high refractive index pair of layers has a combined optical thickness of ½ the wavelength it is designed to reflect. Stacks of such films are commonly referred to as quarterwave stacks. If a wide angle reflection is desired, the layers can have a gradation in thickness from one end of the stack to the other. For multilayer optical films concerned with the visible and the near infrared wavelengths, a quarterwave stack design results in each of the layers in the multilayer stack having an average thickness of not more than about 0.5 micrometers.

The number of layers in the film is selected to achieve the desired optical properties using the minimum number of layers for reasons of film thickness, flexibility and economy. A larger number of layers may be required to provide reflectance of a larger variation in angle of incidence. In addition, to accommodate variation in angle of incidence the layers should have varying thicknesses. However, the number of layers is preferably less than 2,000, more preferably less than 1,000, and even more preferably less than 500.

One way to produce a multilayer reflector is to biaxially stretch a multilayer stack. For a high efficiency reflective film, average transmission along each stretch direction at normal incidence over the activating spectral region is desirably less than 50 percent (reflectance greater than 50 percent), preferably less than 25 percent (reflectance greater than 75 percent), more preferably less than 10 percent (reflectance greater than 90 percent), and even more preferably less than 5 percent (reflectance greater than 95 percent). In a preferred embodiment, the average transmission of light scattered at wide angles within the photosensitive layers over the activating spectral region is desirably less than 50 percent (reflectance greater than 50 percent), preferably less than 25 percent (reflectance greater than 75 percent), more preferably less than 10 percent (reflectance greater than 90 percent), and even more preferably less than 5 percent (reflectance greater than 95 percent).

As discussed above, the ability to achieve the desired relationships among the various indices of refraction, and thus the optical properties of the multilayer film, is influenced by the processing conditions used to prepare the multilayer film. In the case of organic polymers which can be oriented by stretching, the films are generally prepared by co-extruding the individual polymers to form a multilayer film and then orienting the film by stretching at a selected temperature, optionally followed by heat-setting at a selected temperature.

Multilayer Material Selection

One factor that determines the reflectance characteristics of the film of the invention is the materials selected for the layers in the reflector. Many different materials may be used, and the exact choice of materials for a given application depends on the desired match and mismatch obtainable in the refractive indices between the various optical layers along a particular axis, as well on as the desired physical properties in the resulting product. For simplicity, the films will be described further considering an optical stack made from only two materials, referred to herein as the first polymer and the second polymer.

The first and second optical layers and the optional non-optical layers of the multilayer reflector of the present invention are typically composed of polymers such as, for example, polyesters. The term "polymer" will be understood to include homopolymers and copolymers, as well as polymers or copolymers that may be formed in a miscible blend, for example, by coextrusion or by reaction, including, for example, transesterification. The terms "polymer", "copolymer", and "copolyester" include both random and block copolymers.

Polyesters for use in the multilayer reflective mirrors of the present invention generally include carboxylate and glycol subunits and are generated by reactions of carboxylate monomer molecules with glycol monomer molecules. Each carboxylate monomer molecule has two or more carboxylic acid or ester functional groups and each glycol monomer molecule has two or more hydroxy functional groups. The carboxylate monomer molecules may all be the same or there may be two or more different types of molecules. The same applies to the glycol monomer molecules. Also included within the term "polyester" are polycarbonates derived from the reaction of glycol monomer molecules with esters of carbonic acid.

Suitable carboxylate monomer molecules for use in forming the carboxylate subunits of the polyester layers include, for example, 2,6-naphthalene dicarboxylic acid and isomers thereof; terephthalic acid; isophthalic acid; phthalic acid; azelaic acid; adipic acid; sebacic acid; norbornene dicarboxylic acid; bi-cyclooctane dicarboxylic acid; 1,6-cyclohexane dicarboxylic acid and isomers thereof; t-butyl isophthalic acid, trimellitic acid, sodium sulfonated isophthalic acid; 2,2'-biphenyl dicarboxylic acid and isomers thereof; and lower alkyl esters of these acids, such as methyl or ethyl esters. The term "lower alkyl" refers, in this context, to C1–C10 straight-chained or branched alkyl groups.

Suitable glycol monomer molecules for use in forming glycol subunits of the polyester layers include ethylene glycol; propylene glycol; 1,4-butanediol and isomers thereof; 1,6-hexanediol; neopentyl glycol; polyethylene glycol; diethylene glycol; tricyclodecanediol; 1,4-cyclohexanedimethanol and isomers thereof; norbornanediol; bicyclo-octanediol; trimethylol propane; pentaerythritol; 1,4-benzenedimethanol and isomers thereof; bisphenol A; 1,8-dihydroxy biphenyl and isomers thereof; and 1,3-bis (2-hydroxyethoxy)benzene.

A polyester useful in the multilayer reflectors of the present invention is polyethylene naphthalate (PEN), which can be made, for example, by reaction of naphthalene dicarboxylic acid with ethylene glycol. Polyethylene 2,6-naphthalate (PEN) is frequently chosen as a first polymer. PEN has a large positive stress optical coefficient, retains birefringence effectively after stretching, and has little or no absorbance within the visible range. PEN also has a large index of refraction in the isotropic state. Its refractive index for polarized incident light of 550 nm wavelength increases when the plane of polarization is parallel to the stretch direction from about 1.64 to as high as about 1.9. Increasing molecular orientation increases the birefringence of PEN. The molecular orientation may be increased by stretching the material to greater stretch ratios and holding other stretching conditions fixed. Other semicrystalline naphthalene dicarboxylic polyesters suitable as first polymers include, for example, polybutylene 2,6-Naphthalate (PBN), polyethylene terephthalate (PET), and copolymers thereof Non-polyester polymers are also useful in creating multilayer reflectors. For example, polyether imides can be used with polyesters, such as PEN and coPEN, to generate a multilayer reflective reflector. Other polyester/non-polyester combinations, such as polyethylene terephthalate and polyethylene (e.g., those available under the trade designation Engage 8200 from Dow Chemical Corp., Midland, Mich.), can be used. Suitable first polymers are described, for example, in U.S. Pat. application Ser. No. 09/229724, now abandoned, entitled "Process for Making Multilayer Optical Film" filed Jun. 13, 1999, U.S. patent application Ser. No. 09/232332, which is now U.S. Pat. No. 6,352,761, entitled "Modified Copolyesters and Improved Multilayer Reflective Films" filed Jan. 15, 1999, U.S. patent application Ser. No. 09/399531, now abandoned, "Optical Bodies Made with a Birefringent Polymer" filed Dec. 12, 1999, and U.S. patent application Ser. No. 09/444756, which is now U.S. Pat. No. 6,498,683, entitled "Multilayer Optical Bodies" filed Nov. 22, 1999 (all commonly assigned to 3M Innovative Properties), all of which are incorporated herein by reference.

A preferred first polymer is a coPEN having carboxylate subunits derived from 90 mol % dimethyl naphthalene dicarboxylate and 10 mol % dimethyl terephthalate and glycol subunits derived from 100 mol % ethylene glycol subunits and an intrinsic viscosity (IV) of 0.48 dL/g. The index of refraction is approximately 1.63. The polymer is herein referred to as low melt PEN (90/10). Another preferred first polymer is a PET having an inherent viscosity of 0.74 dL/g, available from Eastman Chemical Company (Kingsport, Tenn.).

The other required polymer, referred to herein as the second polymer, should be chosen so that in the finished film, the refractive index, in at least one direction, differs significantly from the index of refraction of the first polymer in the same direction. Because polymeric materials are typically dispersive, that is, the refractive indices vary with wavelength, these conditions must be considered in terms of a particular spectral bandwidth of interest. It will be understood from the foregoing discussion that the choice of a second polymer is dependent not only on the intended application of the multilayer optical film in question, but also on the choice made for the first polymer, as well as processing conditions.

The second optical layers can be made from a variety of second polymers having glass transition temperature compatible with that of the first polymer and having an in-plane refractive index substantially different from the refractive index of the first polymer after orientation of the multilayer reflector. Examples of suitable polymers include vinyl polymers and copolymers made from monomers such as vinyl naphthalenes, styrene, maleic anhydride, acrylates, and methacrylates. Examples of such polymers include polyacrylates, polymethacrylates, such as poly (methyl methacrylate) (PMMA), and isotactic or syndiotactic polystyrene. Other polymers include condensation polymers such as polysulfones, polyamides, polyurethanes, polyamic acids, and polyimides. In addition, the second optical layers can be formed from polymers and copolymers such as polyesters and polycarbonates.

Preferred second polymers include homopolymers of polymethylmethacrylate (PMMA), such as those available from Ineos Acrylics, Inc., Wilmington, Del., under the trade designations CP71 and CP80, or polyethyl methacrylate (PEMA), which has a lower glass transition temperature than PMMA. Additional preferred second polymers include copolymers of PMMA (coPMMA), such as a coPMMA made from 75 wt % methylmethacrylate (MMA) monomers and 25 wt % ethyl acrylate (EA) monomers, (available from Ineos Acrylics, Inc., under the trade designation Perspex CP63), a coPMMA formed with MMA comonomer units and n-butyl methacrylate (nBMA) comonomer units, or a blend of PMMA and poly(vinylidene fluoride) (PVDF) such as that available from Solvay Polymers, Inc., Houston, Tex. under the trade designation Solef 1008. Yet other preferred second polymers include polyolefin copolymers such as poly(ethylene-co-octene) (PE-PO) available from Dow-Dupont Elastomers under the trade designation Engage 8200, poly(propylene-co-ethylene)(PPPE) available from Fina Oil and Chemical Co., Dallas, Tex. under the trade designation Z9470, and a copolymer of atactic polypropylene (aPP) and isotactic polypropylene (iPP) available from Huntsman Chemical Corp., Salt Lake City, Utah, under the trade designation Rexflex W111. Second optical layers can also be made from a functionalized polyolefin, such as linear low density polyethylene-g-maleic anhydride (LLDPE-g-MA) such as that available from E. I. dupont de Nemours & Co., Inc., Wilmington, Del., under the trade designation Bynel 4105.

The thin film optical design of the multilayer reflector places certain requirements on the indices of refraction of the constituent layers. For a multilayer stack designed to reflect a narrow band of wavelengths at substantially only one angle near normal incidence, an alternating stack of isotropic polymers can be used, and the index differential between altenating layers need not be very large. For a reflector to perform over a wide range of angles, it is preferable that the in-plane index differentials (n1x–n2x and n1y–n2y) both be relatively large. The wider the range of angles, the more layers are required in the stack design. A larger index differential allows for reflector designs with fewer layers. Index differentials of at least 0.03 are needed. A differential of 0.1 is preferable, and 0.15 is even more preferable. Whereas isotropic materials can be used to fabricate a reflector that performs well at near normal angles of incidence to the film plane, a birefringent multilayer reflector is preferred for large angles of incidence. Assuming that material 1 has the higher in-plane refractive indices such that n1x>n2x, and n1y>n2y it is preferable that n1z<n2z, i.e the z index differential preferably has the opposite sign as the in-plane index differential. Compared to isotropic material multilayers, the reflectivity of a multilayer reflector is improved at oblique angles whenever the z indices of refraction have a smaller difference, including negative values, than the in-plane index differences in the multilayer.

For example, at a specific wavelength, the in-plane refractive indices might be 1.76 for biaxially oriented PEN, while the film plane normal refractive index might fall to 1.49. When PMMA is used as the second polymer in the multilayer construction, its refractive index at the same wavelength, in all three directions, might be 1.495. Another example is the PET/Ecde™ system, in which the analogous refractive indices might be 1.66 and 1.51 for PET, while the isotropic index of Ecdel™ might be 1.52. Where Ecdel TM is a thermoplastic polyester elastomer available from Eastman Chemical Co. Kingsport, Tenn.

Intermediate Layers

In addition to the first and second optical layers, the multilayer reflective film of the present invention optionally includes one or more non-optical layers such as, for example, one or more skin layers or one or more interior non-optical layers, such as, for example, protective boundary layers between packets of optical layers. Non-optical layers can be used to give the multilayer film structure or to protect it from harm or damage during or after processing. For some applications, it may be desirable to include sacrificial protective skins, wherein the interfacial adhesion between the skin layer(s) and the optical stack is controlled so that the skin layers can be stripped from the optical stack before use.

The non-optical layers may be formed from a variety of polymers, such as polyesters, including any of the polymers used in the first and second optical layers. In some embodiments, the material selected for the non-optical layers is similar to or the same as the material selected for the second optical layers. The use of coPEN, coPET, or other copolymer material for skin layers reduces the splittiness (i.e., the breaking apart of a film due to strain-induced crystallinity and alignment of a majority of the polymer molecules in the direction of orientation) of the multilayer optical film. The coPEN of the non-optical layers typically orients very little when stretched under the conditions used to orient the first optical layers, and so there is little strain-induced crystallinity.

The skin layers and other optional non-optical layers can be thicker than, thinner than, or the same thickness as the first and second optical layers. The thickness of the skin layers and optional non-optical layers is generally at least four times, typically at least 10 times, and can be at least 100 times, the thickness of at least one of the individual first and second optical layers. The thickness of the non-optical layers can be varied to make a multilayer reflective film having a particular thickness.

A skin layer may be coextruded on one or both major surfaces of the multilayer stack during its manufacture to protect the multilayer stack from the high shear along the feedblock and die walls, and often an outer layer with the desired chemical or physical properties can be obtained by mixing an additive, such as, for example, a UV stabilizer, into the polymer melt that makes up the skin layer, and coextruding the skin layer with altered properties onto one or both sides of the multilayer optical stack during manufacture.

Techniques for manufacturing polymeric multilayer films are described in detail in U.S. patent application Ser. No. 09/229724, now abandoned.

Additional Layers

Support materials can contain various colorants, pigments, antihalation or accutance dyes if desired. Support materials may be treated using additional procedures (such as corona discharge) to improve adhesion of overlying layers, or subbing or other adhesion-promoting layers can be used. Useful subbing layer formulations include those used for photographic materials including vinylidene halide polymers.

The support may also include an additional layer opposite from the relatively thick intermediate film layer. This additional layer is also relatively thick and is referred to herein as a skin layer. If both layers are present in the photosensitive element, the multilayer reflector is in the middle of the support and provides an increase in speed, but little or no improvement of halation. However, the support may be made without the skin layer or with a skin layer that is removed prior to coating of the photosensitive material. In this instance, the support provides both antihalation and speed increasing effects, provided that wide angle reflecting layer pairs are included.

Preferably, the support is reflective in the infrared and red, or ultraviolet, portions of the spectrum but is transparent to visible light. The support is useful for applications in this region for medical or graphic arts films. A preferred support thickness is in the range of about 4 to 7 mils.

Additional layers known to be useful in photographic and photothermographic elements may be added. Examples of such layers include, antistatic layers, protective topcoat layers. Additional layers may be coextruded on the outside of the skin layers during manufacture of the multilayer film. They may be coated onto the multilayer film in a separate coating operation, or they may be laminated to the multilayer film as a separate film, foil, or rigid or semi-rigid reinforcing substrate.

Photosensitive Material

Although the multilayer, polymeric support may provide benefits when used in any photosensitive element, the benefits are most clearly evident when used in photographic or photothermographic elements.

If the photosensitive element is photographic, any known photographic silver halide emulsion may be used as the photosensitive material.

If the photosensitive element is photothermographic, any known photothermographic material may be used. Materials sensitive to red, infrared or ultraviolet radiation are preferable.

Objects and advantages of this invention will now be illustrated by the following examples, but the particular materials and amounts thereof recited in these examples, as well as other conditions and details, should not be construed to unduly limit this invention.

EXAMPLES

All materials used in the following examples are readily available from standard commercial sources, such as Aldrich Chemical Co. (Milwaukee, Wis.). All percentages are by weight unless otherwise indicated. The following additional terms and materials were used.

Acryloid® A-21 is a poly(methyl methacrylate) polymer available from Rohm and Haas, Philadelphia, Pa.

Butvar® B-79 is a poly(vinyl butyral) resin available from Monsanto Company, St. Louis, Mo.

CAB 171-15S, CAB 381-20 and CAB 500-5 are cellulose acetate butyrate polymers available from Eastman Chemical Co., Kingsport, Tenn.

CBBA is 2-(4-chlorobenzoyl)benzoic acid.

Ecdel™ is a thermoplastic polyester elastomer available from Eastman Chemical Co. Kingsport, Tenn.

2-MBO is 2-mercaptobenzoxazole.

MEK is methyl ethyl ketone (2-butanone).

MeOH is methanol.

MMBI is 5-methyl-2-mercaptobenzimidazole. It is a supersensitizer.

4-MPA is 4-methylphthalic acid.

PEN is 2,6-polyethylene naphthalate

Permanax® WSO is 1,1-bis (2-hydroxy-3,5-dimethylphenyl)-3,5,5-trimethylhexane [CAS RN=7292-14-0] and is available from St. Jean PhotoChemicals, Inc., Quebec. It is a hindered phenol reducing agent (i.e., a developer) for the non-photosensitive reducible source of silver. It is also known as Nonox®.

PET is polyethylene terephthalate. It is used as a support for the photothermographic element.

PETG is Eastar PETG 6763, a copolyester, poly(ethylene-1,4-cyclohexylene-dimethylene terephthalate). The "G" in the designation indicates a second glycol, 1,4-cyclohexanedimethanol, is used in making the polymer. It is available from Eastman Chemical Co., Kingsport, Tenn.

PHZ is phthalazine.

PHP is pyridinium hydrobromide perbromide.

TCPAN is tetrachlorophthalic anhydride.

TCPA is tetrachlorophthalic acid.

THDI is Desmodur® N-3300 is a biuretized hexamethylenediisocyanate available from Bayer Chemical Corporations.

Antifoggant 1 (AF-1) is 2-(tribromomethylsulfonyl) quinoline and is described in U.S. Pat. No. 5,460,938. It has the structure shown below.

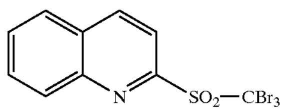

Sensitizing Dye-1 is described in U.S. Pat. No. 5,541,054. It has the structure shown below.

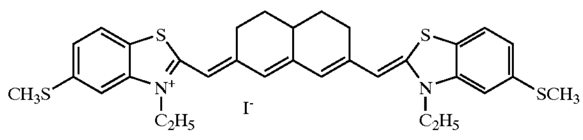

Compound CN-08 is described in U.S. Pat. No. 5,545,515. It has the structure shown below.

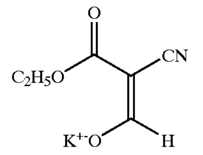

Antihalation Dye-1 (AH Dye-1) is 1,3-bis[2,3-dihydro-2,2-bis[[1-oxohexyl)oxy]-methyl]-1H-perimidin-6yl-]2,4-dihydroxy-, bis(inner sal). Itis belived to have the structure shown below. Details of such dihydroperimidine squarylium dyes and methos of their preparaation can be found in U.S.

Pat. No. 6,063,560 (Suzuki et al.) and U.S. Pat. No. 5,380,635 (Gomez et al), both incorporated hereinby reference.

AH-1

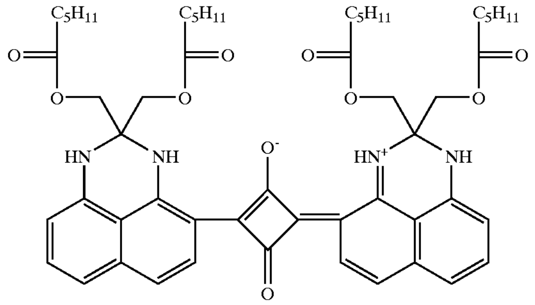

Antihalation Dye-2 (AH-2) is 3H-indolium, 2-[2-[2-chloro-3-[(1,3-dihydro-1,3,3-trimethyl-2H-indol-2-ylidene) ethylidene]-5-methyl-1-cyclohexen-1-yl]ethenyl]-1,3,3-trimethyl-, perchlorate). It is belived to have the structure shown below. Details of such cyamine dyes and methods of their preparation can be found in EP-A-0 342 810 (Leicher), incorporated herein by reference.

AH-2

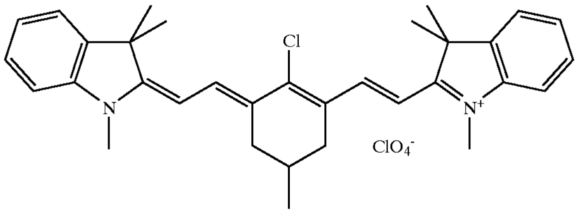

Vinil Sulfone-1 (VS-1) is described in European Laid Open Patent Application No. 0 600 589 A2.

The photothermographic emulsion and topcoat were coated using a dual knife coater. This apparatus consists of two hinged knife-coating blades in series. After raising the hinged knives the support was placed in position on the coater bed. The knives were then lowered and locked into place. The height of the knives was adjusted with wedges controlled by screw knobs and measured with electronic gauges. Knife #1 was raised to a clearance corresponding to the thickness of the support plus the desired coating gap for the emulsion layer (layer #1). Knife #2 was raised to a height equal to the desired thickness of the support plus the desired coating gap for the emulsion layer (layer #1) plus the desired coating gap for the topcoat layer (layer #2).

Aliquots of photothermographic emulsion #1 and topcoat #2 were simultaneously poured onto the support in front of the corresponding knives. The support was immediately drawn past the knives and into an oven to produce a double layered coating. The coated photothermographic or thermographic element was then dried by taping the support to a belt which was rotated inside a BlueM™ oven.

Sensitometric Measurements: Samples were imaged using a laser sensitometer incorporating a 810 nm laser diode. The images obtained were evaluated on a custom built computer scanned densitomer using a filter appropriate to the sensitivity of the of the photothermographic element (when required) and are believed to be comparable to measurements from commercially available densitometers. Sensitometric results include Dmin, Dmax, Speed-1, Speed-2, Speed-3, Average Contrast-A, and Average Contrast-D.

Dmin is the density of the non-exposed areas after development. It is the average of eight lowest density values on the exposed side of the fiducial mark.

Dmax is the highest density value on the exposed side of the fiducial mark.

Speed-1 is the Log 1/E+4 need to achieve a density of 1.00 above Dmin. E is the exposure in ergs/cm$^2$.

Speed-2 is also the log 1/E+4 need to achieve a density of 1.00 above Dmin. E is the exposure in ergs/cm$^2$.

Speed-3 is the Log 1/E+4 needed to achieve a density of 3.00 above Dmin. E is the exposure in ergs/cm$^2$. Speed-3 is important in evaluating the exposure response of a photothermographic element to high intensity light sources.

Contrast-A is the absolute value of the slope of the line joining the density points of 0.07 and 0.17 above Dmin.

Contrast-D is the absolute value of the slope of the line joining the density points of 1.00 and 3.00 above Dmin.

Examples 1–3

Figure 2:
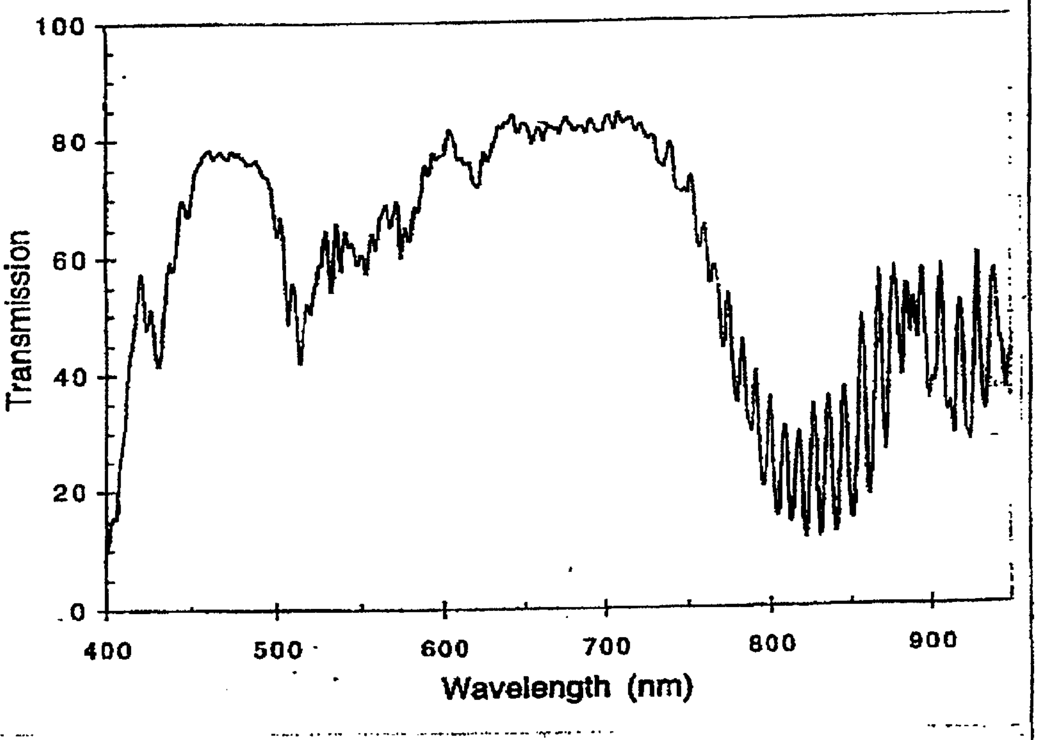
FIG. 2 shows a transmission spectrum for one example of a polymeric support having a quarter wave stack design, with a layer thickness gradient from front to back for increased bandwidth for the support used in Example 1 below.
Figure 3:
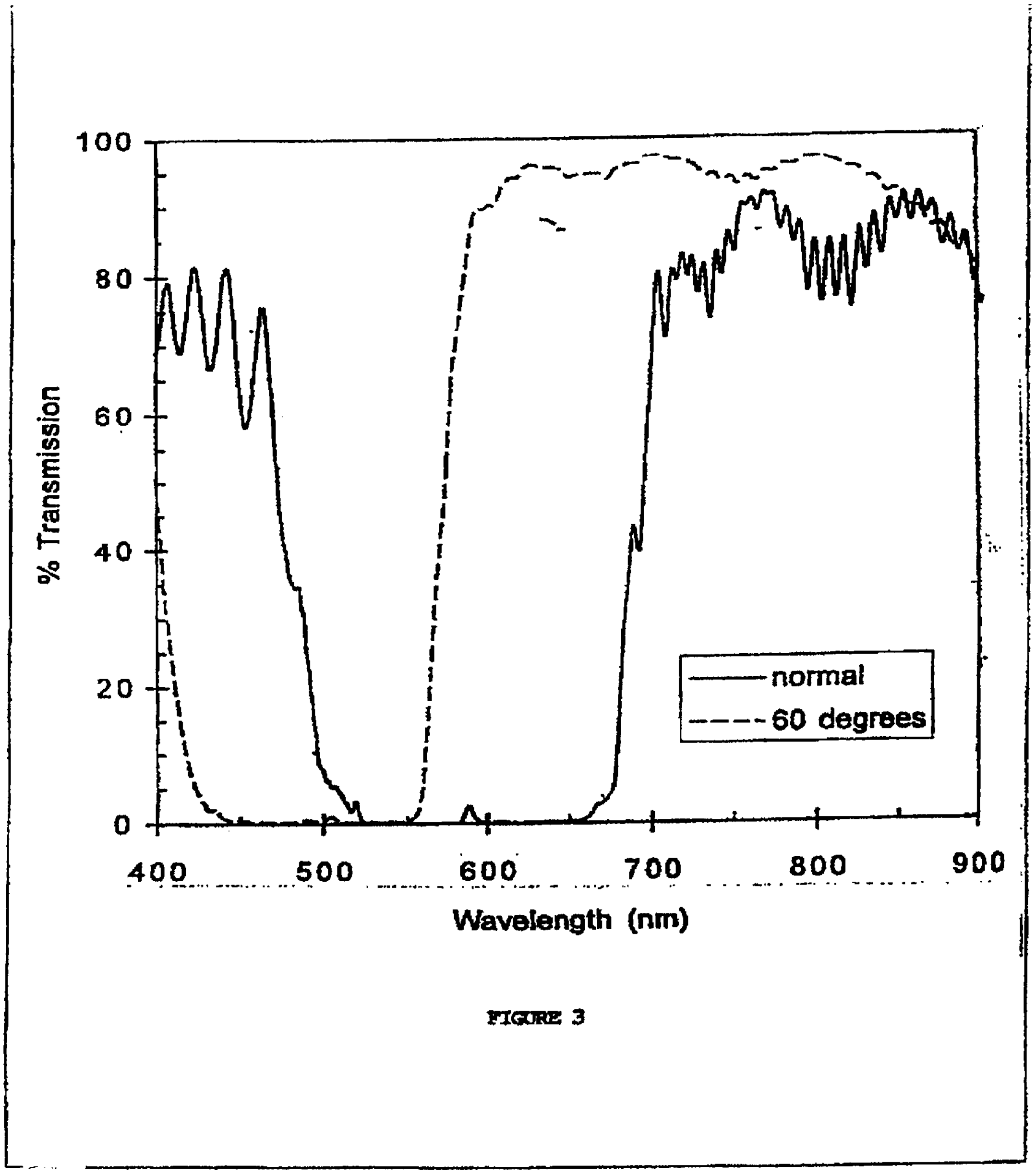
FIG. 3 shows an exemplary transmission curve of a multilayer PEN/PMMA support for normal incidence and for p-polarized light at an angle of 60 degrees from the normal.

Polymeric Support: This support was a quarter wave stack design, with a layer thickness gradient from front to back for increased bandwidth. The support consisted of 600 alternating layers of PET and Ecdel™ a thermoplastic polyester elastomer available from Eastman Chemical Co. Kingsport, Tenn., and skin layer of ⅓ to ½ mil thick. The total film thickness was 5 mil. The transmission spectrum for the support of Example 1 is shown in FIG. 2. The reflectivity was about 75–85% at the 810 nm wavelength of the laser. As evidence that a high reflectivity support with a sharp blue band edge can be made, the transmission of a 209 layer PEN/PMMA support is shown in FIG. 3, for normal incidence and for p-polarized light at 60 degrees. FIG. 3 illustrates that the efficiency of the reflector for p polarized light is unchanged with angle of incidence.

Photothermographic Formulation A: A pre-formed iridium-doped core-shell 10 silver behenate full soap was prepared as described in U.S. Pat. No. 5,434,043 incorporated herein by reference.

The pre-formed soap contained 2.0 wt % of a 0.042 $\mu$m diameter iridium-doped core-shell silver iodobromide emulsion (25% core containing 8% iodide, 92% bromide; and 75% all bromide shell containing 1x10$^{-5}$ mol of iridium). A dispersion of this silver behenate full soap was homogenized to 21.9% solids in 2-butanone containing 1.1% Butvar® B-79 polyvinyl butyral resin.

To 275.9 g of this silver full soap dispersion maintained at 21.1° C. and stirred at 500 rpm, was added 1.48 mL of a solution of 0.42 g of pyridinium hydrobromide perbromide dissolved in 2.35 g of methanol. After 1 hour of mixing 1.48 mL of a solution of 0.632 g of calcium bromide dehydrate dissolved in 2.35 g methanol was added. Mixing for 30 minutes was followed by addition of the a solution containing the materials shown below.

| Material | Amount |
|---|---|
| CBBA | 3.588 g |
| Sensitizing Dye-1 | 0.0098 g |
| MMBI | 0.134 g |
| 2-MBO | 0.0175 g |
| MeOH | 12.088 g |

After 1 hour of mixing, the temperature was lowered from 70° F. (21.1° C.) to 55° F. (12.8° C.). After 30 minutes at 55°

F., 50.4 g of Butvar® B-79 was added. With vigorous stirring at about 1500 rpm for 60 minutes, the following components were added every 15 minutes.

| Material | Amount | |
|---|---|---|
| Antifoggant-1 | 1.794 g | |
| Permanax ® | 14.89 g | |
| THDI | 1.215 g | dissolved in |
| MEK | 1.215 g | |
| PHZ | 1.479 g | dissolved in |
| MeOH | 1.75 g | |
| TCPA | 0.666 g | dissolved in |
| MEK | 2.625 g | |
| MeOH | 0.226 g | |
| 4-MPA | 0.739 g | |
| MeOH | 4.47 g | |

This photothermographic emulsion can be used "as is" to prepare a continuous tone photothermographic element. In Examples 1–3, a solution of 0.0036 g of CN-08 dissolved in 1.50 g of methanol was added to a 15 g aliquot of photothermographic emulsion to form a high contrast photothermographic emulsion.

A topcoat solution was prepared in the following manner; 1.29 g of Acryloid® A-21 and 33.57 g of CAB 171-15S were mixed until dissolved in 404.7 g 2-butanone and 53.4 g of methanol. To 197.2 g of this premix was then added 0.196 g of VS-1. The topcoat was diluted by the addition of 42.5 g of 2-butanone.

The photothermographic emulsion and topcoat solution were dual knife coated onto the thin skin layer of the multilayer polymeric support. The coating gap for the photothermographic emulsion layer was 2.4 mil (61 μm) above the support. The coating gap for the topcoat layer was 3.5 mil (89 μm) over the support. The coatings were dried for 5 minutes at 185° F. (85° C.).

The antihalation layer was prepared substantially as described in Example 5 of U.S. Pat. No. 5,380,636 except that AH Dye-2 replaced AH Dye-1 and was added at 0.12% of total weight, CAB 500-5 was added at 12% of total weight, and CAB 381-20 was added at 4% of total weight. The antihalation layer was knife coated at a coating gap of 3.0 mil (76.2 μm) and dried for 5 minutes at 185° F. (85° C.).

Samples were stored in the dark for 5 days under ambient conditions. They were then cut into 1.5 inch by 8 inch strips (3.8 cm×20.3 cm) and exposed for 6 seconds using a laser sensitometer incorporating a 810 nm laser diode. After exposure, the film strips were developed by heating on a round drum thermal processor for 15 seconds at 250° F. (121° C.) for 15 seconds to give an image.

Example 2 (comparative) and Example 3 (Comparative)

The photothermographic emulsion and topcoat solution were coated as described in Example 1 but onto a 4 mil (101.6 μm) transparent PET support (Example 3 ), and onto a 4 mil (101.6 μm) transparent PET support having an antihalation layer containing AH Dye-2 in CAB 381-20 and CAB 500-5 resin coated on the backside of the support (Example 2). These photothermographic elements were dried, imaged, developed, and evaluated as described above.

The results, shown below, demonstrate that the photosensitive element having the multilayer polymeric support has increased speed over the elements having either a plain PET support, or a PET support having an antihalation backcoat.

| Ex. | Development Conditions | Dmin | Dmax |
|---|---|---|---|
| 1 Invention | 15 sec/250° F. | 0.10 | 4.32 |
| 2 Comparative | 15 sec/250° F. | 0.08 | 4.41 |
| 3 Comparative | 15 sec/250° F. | 0.04 | 4.36 |

| Ex. | Speed-1 | Speed-3 | Contrast-A | Contrast-D |
|---|---|---|---|---|
| 1 Invention | 2.41 | 2.30 | 1.33 | 19.71 |
| 2 Comparative | 1.94 | 1.84 | 1.40 | 23.52 |
| 3 Comparative | 2.25 | 2.18 | 1.59 | 28.87 |

Examples 4–9

Polymeric Support Reflective/Antihalation Film

A coextruded film containing 209 layers was made on a sequential flat-film making line via a coextrusion process. This multilayer polymer film was made from polyethylene naphthalate (PEN) and polymethyl methacrylate (PMMA CP82). A feedblock method such as that described in U.S. Pat. No. 3,801,429, incorporated herein by reference, was used to generate about 209 layers which were coextruded onto a water chilled casting wheel and continuously oriented by conventional sequential length orienter (LO) and tenter equipment. An important feature of this film was use of a strippable skin material during film making that allowed the ¼ wavelength thick optical layers to be exposed on one surface of the finished film.

Polyethylene naphthalate (PEN-60 wt. % phenol/40 wt % dichlorobenzene) with an Intrinsic Viscosity (IV) of 0.56 dl/g was delivered to the feedblock by one extruder at a rate of about 25.6 Kg/hr and the PMMA was delivered by another extruder at a rate of about 26.6 Kg/hr. These meltstreams were directed to the feedblock to create the PEN and PMMA optical layers. The feedblock created 209 alternating layers of PEN and PMMA with the two outside layers of PEN serving as the protective boundary layers (PBL's) through the feedblock. The feedblock was designed to produce an approximately linear gradient in layer thickness for each material with the ratio of thickest to thinnest layers being about 1.7:1. To achieve a smaller ratio for this example, a thermal profile was applied to the feedblock. The portion of the feedblock making the thinnest layers was heated to about 305° C., while the portion making the thickest layers was heated to about 280° C. In this manner the thinnest layers are made thicker than with isothermal feedblock operation, and the thickest layers are made thinner than under isothermal operation. Portions of the feedblock intermediate to these locations were set to follow a linear temperature profile between these two extremes. The overall effect is a narrower layer thickness distribution which results in a narrower reflectance spectrum with higher reflectivity within that band. The casting wheel speed was adjusted for precise control of final film thickness, and therefore, final wavelength selection. The thinnest PEN/PMMA layer pairs were made with an optical thickness of about ½ the wavelength of 810 nm light.

The PMMA melt process equipment was maintained at about 271° C.; the PEN melt process equipment was maintained at about 290° C. The skin-layer modules and die were also maintained at about 290° C.

After the feedblock, skin layers were added to the melt stream via two extruders. A thin PEN skin, delivered from the same extruder as the optical (¼ wavelength thick) PEN layers, was added on the side of the meltstream containing the thinnest layers, at a rate of 28.8 Kg/hr. A third extruder delivered FINA 3661 polypropylene for the other skin at a rate of about 18.2 Kg/hr. The material stream then passed through a film die and onto a water cooled casting wheel using an inlet water temperature of about 7° C. The polypropylene skin was placed on the casting wheel side of the web and the PEN skin on the air side. A high voltage pinning system was used to pin the extrudate to the casting wheel. The pinning wire was about 0.17 mm thick and a voltage of about 5.5 kV was applied. The pinning wire was positioned manually about 2 to 3 mm from the web at the point of contact to the casting wheel to obtain a smooth appearance to the cast web. The cast web was continuously oriented by conventional sequential length orienter (LO) and tenter equipment. The polypropylene skin was removed from the web with an auxiliary winder before the web reached the LO.

Figure 5:
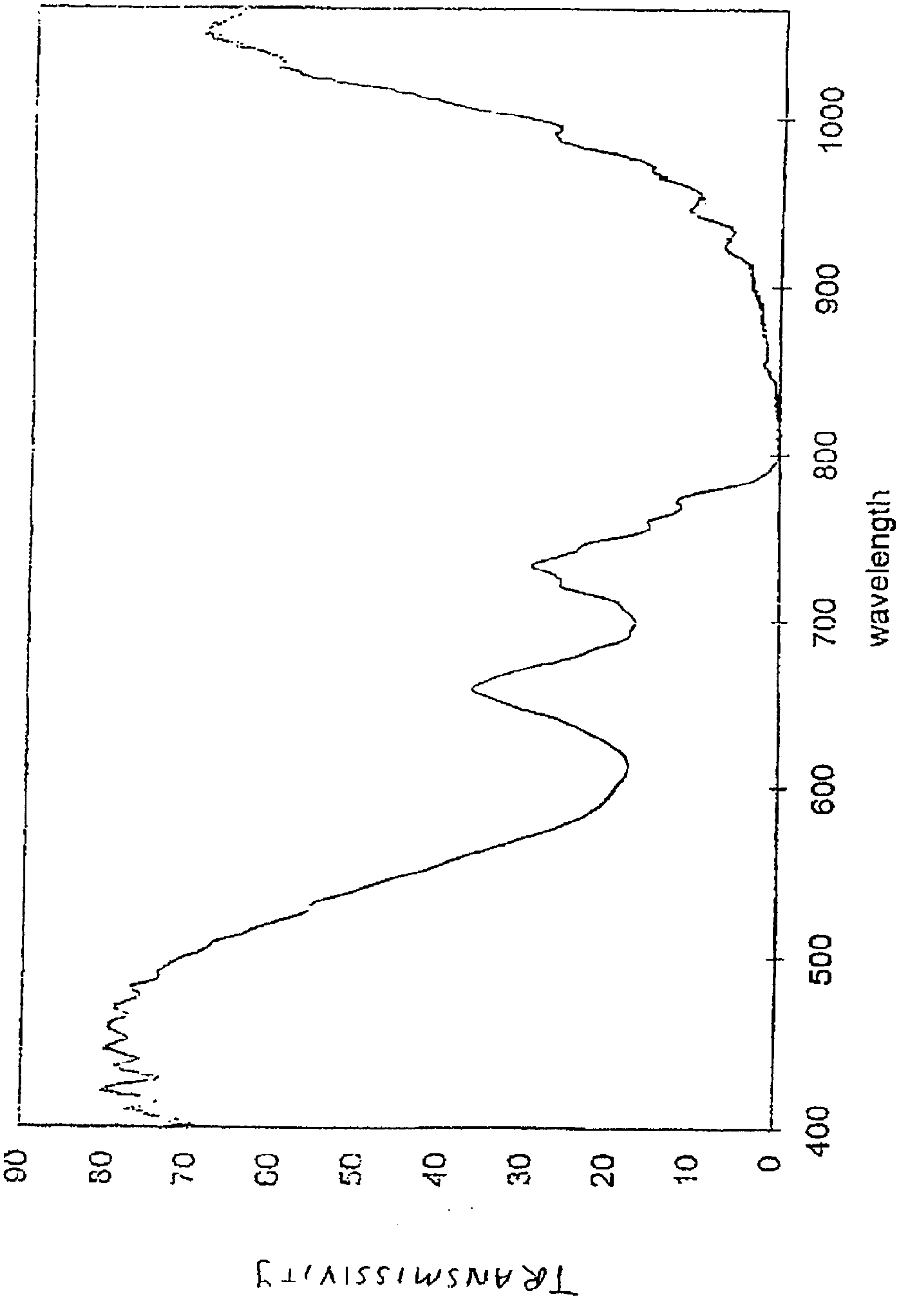
FIG. 5 shows exemplary transmissivity properties of a film made in accordance with the invention.

The cast web was length oriented with a draw ratio of about 2.8: 1. Preheat rollers in the LO brought the web temperature up to about 120° C. Final heating in the draw gap was with an infrared lamp, with an estimated web temperature of about 130° C. In the tenter, the film was preheated before drawing to about 138° C. in about 15 seconds and then drawn in the transverse direction at about 143° C. to a draw ratio of about 4.5: 1, at a rate of about 30% per second. The nominal thickness of the support was about 1.8 mils. The transmissivity properties of the support are shown in FIG. 5.

In the film prepared by this method, the thickest polymeric layers were at the surface stripped of polypropylene, and the thinnest layers were in contact with the thick PEN support. The polypropylene skin was stripped off after casting of the film. The layers were tuned to reflect at 810 nm. Upon exposure of a photothermographic material coated on the film, light passing through the photothermographic layer and penetrating deep within the polymeric multilayer support with normal incidence of light would be reflected back through the photothermographic layer. Any rays scattered by the photothermographic layer at moderate angles will pass through the photothermographic layer through to the top layer of the polymeric multilayer support (the thickest layers) and be reflected within the multilayer reflective support to reduce halation.

Photothermographic Formulation B: A pre-formed iridium-doped core-shell silver behenate full soap was prepared as described in U.S. Pat. No. 5,434,043 incorporated herein by reference.

The pre-formed soap contained 2.0 wt % of a 0.042 μm diameter iridium doped core-shell silver iodobromide emulsion (25% core containing 8% iodide, 92% bromide; and 75% all bromide shell containing $1\times10^{-5}$ mol of iridium). A dispersion of this silver behenate full soap was homogenized to 26.5% solids in 2-butanone containing 1.1% Butvar®B-79 polyvinyl butyral resin.

To 161.4 g of the silver full soap dispersion was added 0.54 mL of a solution of 0.75 g of pyridinium hydrobromide perbromide dissolved in 1.39 g methanol. After 1 hour of mixing 1.14 mL of a solution of 1.13 g of calcium bromide dehydrate dissolved in 3.39 g methanol was added. After 30 minutes of mixing, 1.0 g B-79 was added, and the following infrared sensitizing dye solution was added 15 minutes later.

| Material | Amount |
|---|---|
| CBBA | 2.563 g |
| Sensitizing Dye-1 | 0.0070 g |
| MMBI | 0.0958 g |
| 2-MBO | 0.0125 g |
| MEK | 2.159 g |
| MeOH | 6.476 g |

After 1 hour of mixing, the temperature was lowered from 70° F. to 55° F. After 30 minutes at 55° F., 35.0 g of Butvar® B-79 was added. With vigorous stirring at about 1500 rpm for 60 minutes, the following component solutions were added every 15 minutes.

| Material | Amount | |
|---|---|---|
| Antifoggant- 1 | 1.794 g | dissolved in |
| MEK | 15.703 g | |
| THDI | 0.869 g | dissolved in |
| MEK | 0.869 g | |
| PHZ | 1.057 g | dissolved in |
| MeOH | 2.501 g | |
| TCPA | 0.472 g | dissolved in |
| MEK | 0.945 g | |
| 4-MPA | 0.529 g | dissolved in |
| MeOH | 1.665 g | |
| Permanax ® | 10.573 g | |

A solution of high contrast-promoting agent CN-08 was added.

| Material | Amount |
|---|---|
| CN-08 | 0.190 g dissolved in |
| MeOH | 0.818 g and |
| MEK | 2.454 g |

A topcoat solution was prepared in the following manner: 1.30 g of Acryloid A-21™ and 33.98 g of CAB 171-15S were mixed until dissolved in 409.7 g of 2-butanone and 54.0 g of methanol. After 60 minutes of mixing, 0.989 g of VS-1 was added.

The photothermographic emulsion layer and topcoat were dual knife coated onto the polymeric support. The coating gap for the photothermographic emulsion layer was 2.4 mil (61μ) above the support. The coating gap for the topcoat layer was 3.6 mil(91μ) above the support. The coatings were dried for 5 minutes at 185° F.

The samples were exposed using a 810 nm laser diode sensitometer. The coatings were processed on a heated roll processor for 15 seconds at 255° F.

The antihalation layer was prepared substantially as described in Example 5 of U.S. Pat. No. 5,380,636 except that AH Dye-2 replaced AH Dye-1 and was added at 0.07% of total weight, CAB 500-5 was added at 8.5% of total weight, and CAB 381-20 was added at 2.8% of total weight. The antihalation layer was knife coated at a coating gap of 3.0 mil (76.2 μm) and dried for 5 minutes at 185° F. (85° C.).

The support may have an antihalation backcoat with maximum absorption at 810 nm (AH Dye 1) or 790 nm (AH Dye 2) using the standard formulation for these layers and coated at a gap thickness of 3.0 mil.

The photothermographic emulsion layer was coated directly onto the multilayer polymeric stack to demonstrate both increased speed and reduced halation. A schematic of the film layer structure is shown in FIG. 4. For comparison with and without an antihalation layer, the AH Dye 2 antihalation layer was coated onto the non-strippable PEN support. To show increased halation with the photothermographic layer when not in direct contact with the polymeric multilayer support with exposure through the thick PEN into the thin layers of the multilayer polymeric support; the photothermographic composition was coated onto the PEN support both with and without an antihalation layer coated directly onto the multilayer polymeric support. For comparison with standard supports and to demonstrate the increased speed with the multilayer reflective support, the photothermographic composition was also coated onto a 2.5 mil PET support with and without an antihalation backcoat.

The reflective support was about 99% reflective at 810 nm but also greater than 50% reflective from 540 nm to 810 nm. This resulted in some coloring of the base which added to the sensitometric Dmin. Higher Dmin was due to the color of the base and not image fog.

The sensitometric response, summarized below, demonstrates that without an antihalation layer, Speed-2 of the reflective support was the same at 2.46 logE for the photothermographic emulsion layer coated on either the polymeric multilayers (Example 8) or the thick PEN support (Example 6). Speed-2 for the standard PET support was 2.21 logE (Example 4). A speed increase of 0.25 logE was observed with the reflective support. However, the photothermographic emulsion layer coated onto the polymeric multilayers (Example 8) showed a sharper image or less halation than the photothermographic emulsion layer coated onto the PEN base (Example 6). Halation was similar for the PET support (Example 4) as compared to (Example 6). There was some laser exposure leakage to the backside of (Example 8) or large off-angle exposure, as a sharper image was observed with an antihalation backcoat onto the thick PEN support (Example 9); however, a faster speed, reduced-halation film was demonstrated with the non-AH support (Example 8). With antihalation backcoats the reflective film showed faster speeds of 0.28 to 0.16 logE (Examples 7, 9) as compared to the corresponding PET film with AH backcoat (Example 5).

| Ex. | Support Type | Ag Layer Coated Onto | AH | Dmin | D Hi | Dmax |
|---|---|---|---|---|---|---|
| 4 | Comparative | | No | 0.059 | 5.248 | 5.277 |
| 5 | Comparative | | Yes | 0.1 | 5.275 | 5.271 |
| 6 | Invention | PEN support | No | 0.058 | 5.015 | 5.22 |
| 7 | Invention | PEN support | Yes | 0.126 | 5.232 | 5.316 |
| 8 | Invention | Optical Stack | No | 0.104 | 4.236 | 5.283 |
| 9 | Invention | Optical Stack | Yes | 0.116 | 5.246 | 5.276 |

| Ex. | Speed-2 | Speed-3 | Contrast-1 | Contrast-3 |
|---|---|---|---|---|
| 4 | 2.21 | 2.12 | 20.66 | 26.35 |
| 5 | 1.92 | 1.82 | 18.25 | 19.8 |
| 6 | 2.46 | 2.38 | 17.94 | 32.12 |
| 7 | 2.20 | 2.12 | 20.01 | 25.35 |
| 8 | 2.46 | 2.34 | 14.71 | 48.10 |
| 9 | 2.08 | 2.01 | 15.73 | 40.77 |

Examples 10–15

Polymeric Support Reflective/Woodgrain Reducing Film

A multilayer film containing about 418 layers was made on a sequential flat-film making line via a coextrusion process. This multilayer polymer film was made with PEN and PETG 6763. A feedblock method (such as that described by U.S. Pat. No. 3,801,429) was used to generate about 209 layers with an approximately linear layer thickness gradient from layer to layer through the extrudate. Polyethylene naphthalate (PEN-60 wt. % phenol/40 wt. % dichlorobenzene) with an Intrinsic Viscosity (IV) of 0.48 dl/g was delivered to the feedblock by one extruder at a rate of 37.9 Kg/hr. The PETG was directed to the feedblock by a second extruder at a rate of 40.4 Kg/hr.

The feedblock used to make the film for this example was designed to give a linear layer thickness distribution with a 1.3:1 ratio of thickest to thinnest layers under isothermal conditions.

After the feedblock, the same PEN extruder delivered PEN as protective boundary layers (PBL's, where the PBL's had the same thickness on both sides of the optical layer's meltstream) to the meltstream at about 23 Kg/hr. The material stream then passed though an asymmetric two times multiplier (See U.S. Pat. Nos. 5,094,788 and 5,094,793, both incorporated herein by reference) with a multiplier ratio of about 1.50. The multiplier ratio is defined as the average layer thickness of layers produced in the major conduit divided by the average layer thickness of layers in the minor conduit. Each set of 209 layers has the approximate layer thickness profile created by the feedblock, with overall thickness scale factors determined by the multiplier design and film extrusion rates. Although this multiplier ratio leaves a spectral reflectance gap between the two reflectance bands created by the two sets of 209 layers, this setup was chosen to produce the thicker layers needed reflect 810 nm radiation that is scattered by the photothermographic emulsion at large angles in the film. The thinnest layers of the entire stack were designed to reflect 810 nm radiation at normal incidence, while the thicker layers, especially the second set of 209 layers, were tuned to reflect light that is scattered beyond the critical angle in a film base and would totally internally reflect (TIR) from the back surface of the film. After the multiplier, a thick symmetric PBL (skin layer) was added at about 34.5 Kg/hr that was fed from a third extruder. Then the material stream passed through a film die and onto a water cooled casting wheel using an inlet water temperature of about 7° C. The PETG melt process equipment was maintained at about 250° C.; and the PEN melt process equipment was maintained at about 285° C. and the feedblock, multiplier, and die were also maintained at about 285° C.

A high voltage pinning system was used to pin the extrudate to the casting wheel. The pinning wire was about 0.17 mm thick and a voltage of about 5.5 kV was applied. The pinning wire was positioned manually to about 2 to 3 mm from the web at the point of contact to the casting wheel to obtain a smooth appearance to the cast web. The cast web was continuously oriented by conventional sequential length orienter (LO) and tenter equipment.

The web was length oriented to a draw ratio of about 3.3 at about 130° C. The film was preheated to about 138° C. in about 28 seconds in the tenter and drawn at about 140° C. in the transverse direction to a draw ratio of about 5.5 at a rate of about 15% per second. The film was then heat set for about 24 seconds at about 227° C. The casting wheel speed was adjusted for precise control of final film thickness, and therefore, final wavelength selection of the reflector. The finished film had a final thickness of about 0.10 mm.

Figure 6:
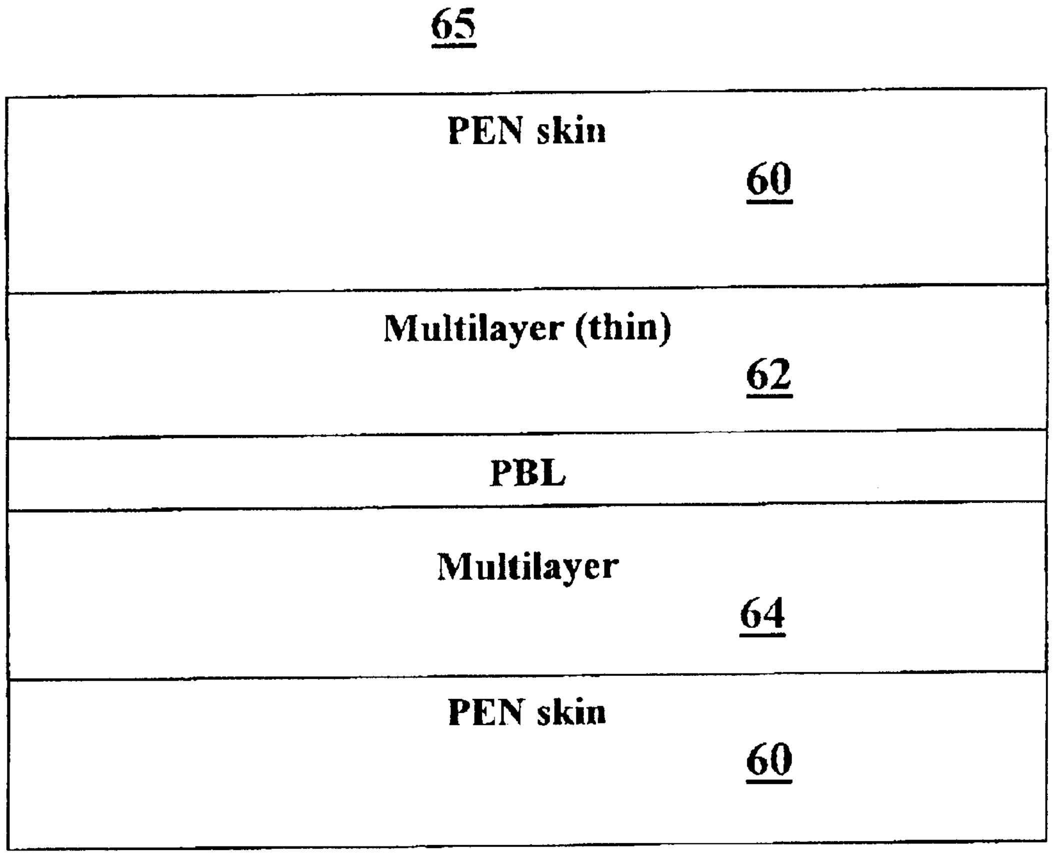
FIG. 6 shows a schematic diagram of an example of a polymeric multilayer support.
Figure 9:
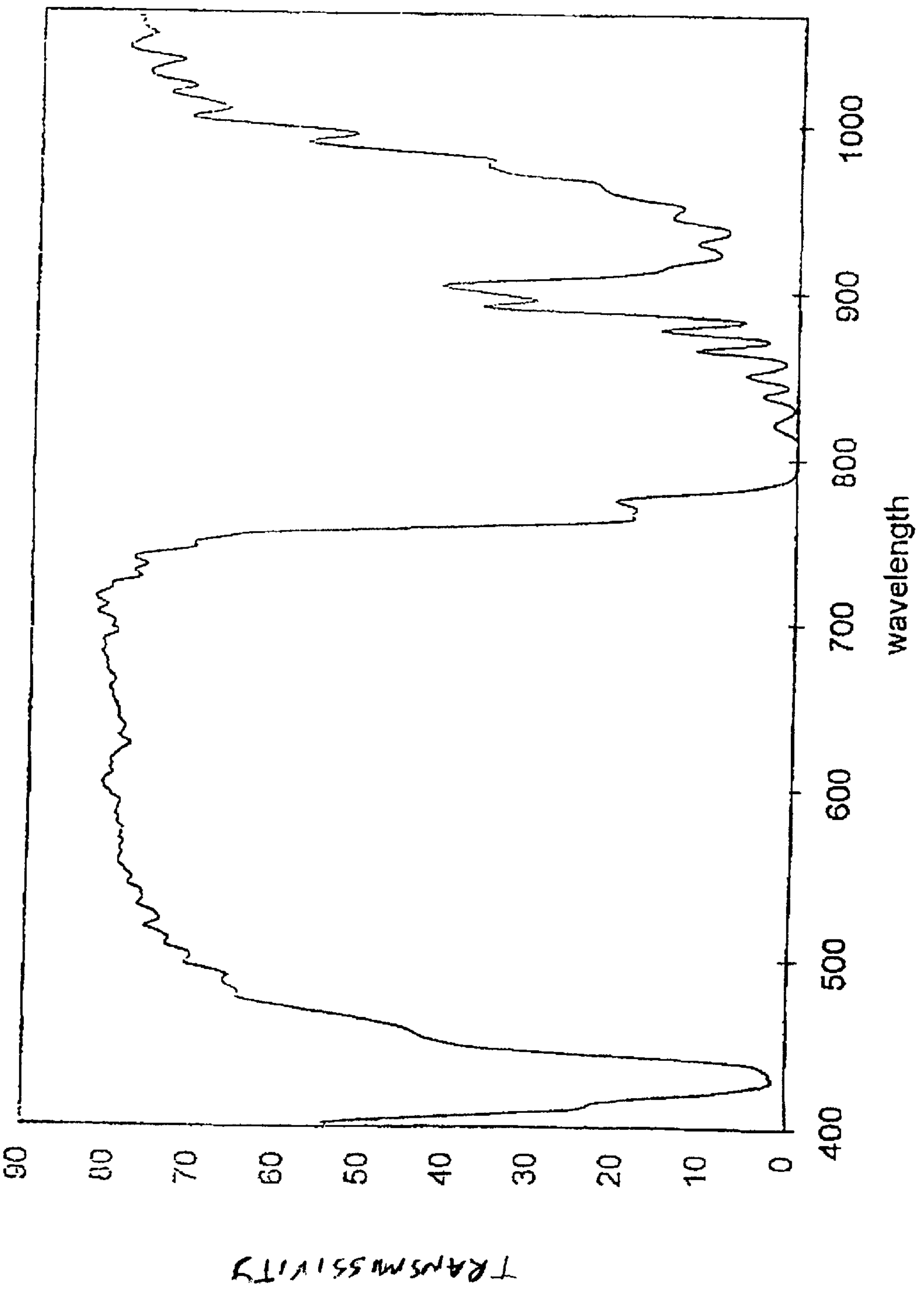
FIG. 9 shows exemplary transmissivity properties of another film layer structure made in accordance with the invention.

Now referring to FIG. 6, a schematic diagram of an example of a polymeric multilayer support made in accordance with the teachings of the invention is shown. The support was coextruded with a thick PEN layer over the reflective polymeric multilayers. The polymeric multilayer support consisted of the thinnest layers reflective to about 90%–99% to normal incident 810 nm light, and the thicker layers reflecting off-angle exposures. The thick PEN support was symmetrically co-extruded on each side of this support. The nominal thickness of this support was 4 mil. The transmissivity properties of the support are shown in FIG. 9.

The photothermographic emulsion was coated on the side of the thickest polymeric multilayers. Woodgrain is reduced when the normal incident light that passes through the photothermographic layer into the reflective support penetrates through a thick PEN skin and through the polymeric multilayer support and reflects back such that any intensity oscillations are reduced to fine patterns.

The antihalation layer was prepared substantially as described in Example 5 of U.S. Pat. No. 5,380,636. The antihalation layer was knife coated at a coating gap of 3.0 mil (76.2 μm) and dried for 5 minutes at 185° F. (85° C.).

To demonstrate improved reduction of woodgrain, the photothermographic layer was coated on the reflective support in which the thickest polymeric layers were closest to the photothermographic layer. This was prepared both with and without the AH Dye 1 antihalation layer on the backside of the support closest to the thin layers of the polymeric multilayer support. As a comparison, the same photothermographic and antihalation layers were coated on the opposite surface of the reflective support. To demonstrate increased speed, a 4 mil PET support was coated with the same photothermographic layer with and without the antihalation backcoat.

There was a small amount of color to the reflective support which added to the sensitometric Dmin. This was due to the support and not image fog. The sensitometric responses, summarized below, demonstrate that without an antihalation layer, as in Examples 12 and 14, Speed-2 of the reflective support was approximately the same for the photothermographic emulsion layer coated on either side of the polymeric multilayer support. Example 12 had a photothermographic layer closest to the thinnest layers of the polymeric multilayer support, and Example 14 had a photothermographic layer closest to the thickest layers of the polymeric multilayer support. Speed-2 for the PET support was 2.23 logE. A speed increase of 0.28 logE was observed with the reflective support. Halation was present with all these coatings, but no woodgrain pattern was observed for the coating in which the photothermographic layer was coated on the side closest to the thickest layers of the polymeric multilayer support (Example 14). Woodgrain was observed with Example 12. With antihalation backcoats, a sharp image was observed for the 4 mil PET support (Example 11) and the reflective supports (Examples 13,15). Speed-2 was decreased by 0.24 logE with the PET support, but Speed-2 was decreased by only 0.15 logE with the reflective supports. With antihalation layers, an increase in Speed-2 of 0.36 logE was observed with the reflective support. No woodgrain was observed with the photothermographic layer coated closest to the thickest layers of the polymeric multilayer support (Example 15), but was observed with Example 13.

| Example | Support Type | Ag Layer Coated On Side | AH | Dmin | D-Hi | Dmax |
|---|---|---|---|---|---|---|
| 10 | Comparative | | No | 0.048 | 4.942 | 5.01 |
| 11 | Comparative | | Yes | 0.045 | 4.942 | 5.083 |
| 12 | Invention | Close to Thin Layers | No | 0.09 | 5.008 | 5.073 |
| 13 | Invention | Close to Thin Layers | Yes | 0.084 | 4.937 | 5.044 |
| 14 | Invention | Close to Thick Layers | No | 0.088 | 5.049 | 5.123 |
| 15 | Invention | Close to Thick Layers | Yes | 0.08 | 4.969 | 5.06 |

| Ex. | Speed-2 | Speed-3 | Contrast-1 | Contrast-3 |
|---|---|---|---|---|
| 10 | 2.23 | 2.16 | 22.10 | 32.40 |
| 11 | 1.99 | 1.89 | 19.24 | 19.47 |
| 12 | 2.50 | 2.43 | 21.66 | 26.03 |
| 13 | 2.35 | 2.25 | 16.77 | 18.00 |
| 14 | 2.52 | 2.44 | 24.87 | 22.50 |
| 15 | 2.36 | 2.29 | 22.39 | 28.70 |

Examples 16–21

Polymeric Support Reflective/Woodgrain Reducing Film

A coextruded film containing 209 layers was made on a sequential flat-film making line via a coextrusion process. This multilayer polymer film was made from polyethylene naphthalate (PEN) and polymethyl methacrylate (PMMA CP82). A feedblock method (such as that described by U.S. Pat. No. 3,801,429) was used to generate about 209 layers which were coextruded onto a water chilled casting wheel and continuously oriented by conventional sequential length orienter (LO) and tenter equipment.

To make the multilayer film, polyethylene naphthalate (PEN-60 wt. % phenol/40 wt. % dichlorobenzene) with an Intrinsic Viscosity (IV) of 0.48 dl/g was delivered to the feedblock by one extruder at a rate of 25.6 Kg/hr and the PMMA was delivered by another extruder at a rate of 26.6 Kg/hr. These meltstreams were directed to the feedblock to create the PEN and PMMA optical layers. The feedblock created 209 alternating layers of PEN and PMMA with the two outside layers of PEN serving as the protective boundary layers (PBL's) through the feedblock. The feedblock was designed to produce an approximately linear gradient in layer thickness for each material with the ratio of thickest to thinnest layers being about 1.7:1. The thinnest PEN/PMMA layer pairs were made with an optical thickness of about ½ the wavelength of 810 nm light. The PMMA melt process equipment was maintained at about 27 1° C.; the PEN melt process equipment was maintained at about 285° C. The skin-layer modules and die were also maintained at about 285° C. and the feedblock was maintained at 296° C. Heating the feedblock to a temperature higher than the incoming meltstreams has the effect of narrowing the layer thickness distribution, and therefore the optical spectrum of the optical stack. The reflectivity within the reflection band is thereby increased.

After the feedblock, skin layers were added to the melt stream via two extruders. A thin PEN skin, delivered from the same extruder as optical, ¼ wavelength thick, PEN layers, was added on the side containing the thinnest layers, at a rate of 28.8 Kg/hr. The thinnest layers were tuned to reflect 810 nm radiation at normal incidence. A third extruder delivered 0.48 IV PEN for the other skin at a rate of about 68.2 Kg/hr. The thicker skin was placed on the side of the thicker optical layers with the intention of creating as large an asymmetry as possible in the distance from each of the film surfaces to the optical layers tuned to 810 nm. Examples 16–21 used a structure similar to FIG. 7 except that, in the examples, the first and second intermediate layers 12 and 20 had unequal thicknesses.

The material stream then passed through a film die and onto a water cooled casting wheel using an inlet water temperature of about 7° C. A high voltage pinning system was used to pin the extrudate to the casting wheel. The pinning wire was about 3–5 mm thick and a voltage of about 5.5 kV was applied. The pinning wire was positioned manually about 2 to 3 mm from the web at the point of contact to the casting wheel to obtain a smooth appearance to the cast web. The cast web was continuously oriented by conventional sequential length orienter (LO) and tenter equipment.

Figure 8:
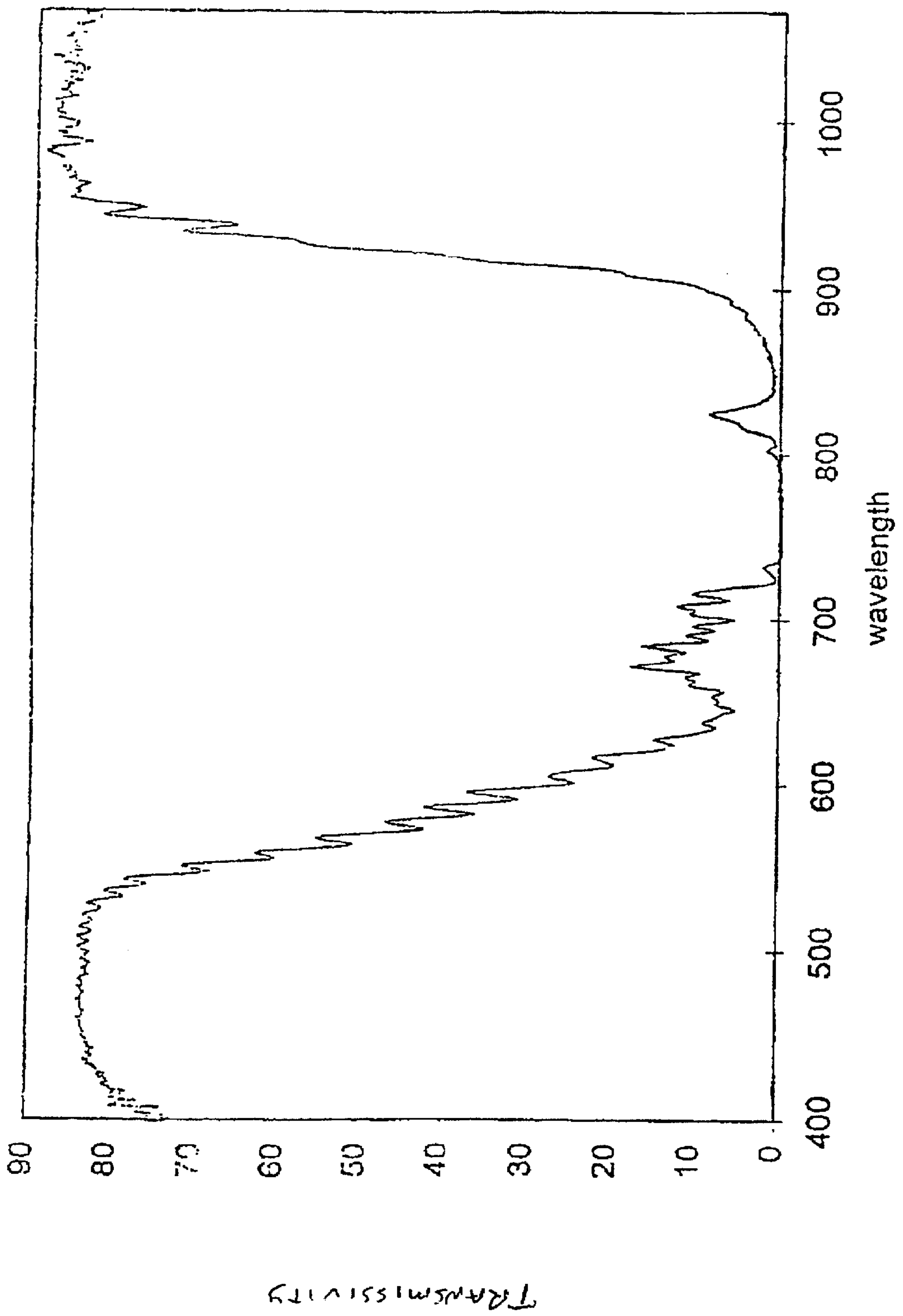
FIG. 8 shows exemplary transmissivity properties of another film layer structure made in accordance with the invention.

The cast web was length oriented with a draw ratio of about 2.8: 1. Preheat rollers in the LO brought the web temperature up to about 120° C. Final heating in the draw gap was with an infrared lamp, with an estimated web temperature of about 130° C. In the tenter, the film was preheated before drawing to about 138° C. in about 15 seconds and then drawn in the transverse direction at about 143° C. to a draw ratio of about 4.5: 1, at a rate of about 30% per second. The casting wheel speed was adjusted for precise control of final film thickness, and therefore, final wavelength selection of the reflector. The finished film had a final thickness of about 1.8 mils. Transmissivity properties of the support are shown in FIG. 8.

The antihalation layer was prepared substantially as described in Example 5 of U.S. Pat. No. 5,380,636. The antihalation layer was knife coated at a coating gap of 3.0 mil (76.2 μm) and dried for 5 minutes at 185° F. (85° C.).

To reduce woodgrain patterns, the polymeric multilayer support consisted of the thickest layers reflecting 810 nm normal incident light closest to a thick PEN layer and the thinner polymeric layers that reflect the off-angle light closest to the thinner PEN skin. Large off angle exposure will pass though the polymeric multilayer support to scatter and cause halation off the backside of the support. This is expected with the polymeric layers non-adjacent to the photothermographic layer. The photothermographic layer was coated on the thick PEN side closest to the thick polymeric layers to demonstrate speed, reduced woodgrain and halation. For comparison, the photothermographic layer was coated on the opposite side. Both of these coatings were coated with and without a AH DYE 1 antihalation backcoat. To demonstrate the reflective support speed improvement, a 2 mil PET support was coated with and without the antihalation backcoat.

The sensitometric response, summarized below, demonstrates that without an antihalation layer, Speed-2 of the reflective polymeric multilayer support was approximately the same for the photothermographic layer coated on the either the thick PEN side with the thickest layers of the polymeric multilayer support (Example 20), or coated on the side closest to the thinner polymeric layers (Example 18). Speed-2 with the standard PET support was 2.23 logE (Example 16). An increase in Speed-2 of 0.25 logE was observed with the reflective support. Halation was present with all these coatings. However, with the photothermographic emulsion layer coated on the thick PEN skin and closest to the thick polymeric layers (Example 20), only a small amount of woodgrain was present, but woodgrain was observed with Example 18. With the antihalation backcoat, the images were sharp for both the PET support (Example 17) and the reflective supports (Examples 19, 21). Speed-2 with the PET support was decreased by 0.29 logE, but with the reflective supports the speed was decreased by only 0.23 logE. A slight amount of woodgrain was observed with the photothermographic layer coated on the thick PEN side closest to the thickest layers of the polymeric multilayer support (Example 21), but was observed with Example 19.

| Example | Support Type | Ag Layer Coated On Side | AH | Dmin | D-Hi | Dmax |
|---|---|---|---|---|---|---|
| 16 | Comparative | | No | 0.054 | 5.07 | 5.11 |
| 17 | Comparative | | Yes | 0.055 | 5.11 | 5.11 |
| 18 | Invention | Close to Thin Layers | No | 0.058 | 4.99 | 5.20 |
| 19 | Invention | Close to Thin Layers | Yes | 0.062 | 5.08 | 5.18 |
| 20 | Invention | Close to Thick Layers | No | 0.056 | 5.17 | 5.20 |
| 21 | Invention | Close to Thick Layers | Yes | 0.061 | 5.06 | 5.14 |

| Ex. | Speed-2 | Speed-3 | Contrast-1 | Contrast-3 |
|---|---|---|---|---|
| 16 | 2.23 | 2.15 | 21.12 | 30.81 |
| 17 | 1.94 | 1.87 | 20.63 | 25.99 |
| 18 | 2.49 | 2.39 | 19.61 | 21.01 |
| 19 | 2.25 | 2.16 | 20.95 | 17.75 |
| 20 | 2.48 | 2.41 | 22.04 | 33.86 |
| 21 | 2.25 | 2.17 | 22.91 | 33.99 |

The foregoing description of the invention is necessarily detailed so as to provide understanding of the invention's best mode of practice. It is to be understood, however, that various modifications of detail, rearrangement, addition, and deletion of components may be undertaken without departing from the invention's spirit, scope, or essence.

What is claimed is:

1. A photosensitive element comprising:

a layer of a photosensitive material sensitive to actinic radiation in a selected wavelength region; and a polymeric multilayer reflector bearing the layer of the photosensitive material, wherein the polymeric multilayer reflector comprises alternating layers of polymers having different indices of refraction, and wherein said alternating layers are isotropic.

2. The photosensitive element of claim 1 wherein the polymeric multilayer reflector reflects at least 50% of actinic radiation in the selected wavelength region.

3. The photosensitive element of claim 1 wherein the photosensitive material is photothermographic.

4. The photosensitive element of claim 1 wherein the photosensitive material is photographic.

5. The photosensitive element of claim 1 wherein at least one of said alternating layers is birefringent.

6. The photosensitive element of claim 1 wherein the polymeric multilayer reflector comprises a cholesteric film.

7. The photosensitive element of claim 6 wherein said cholesteric film comprises a multiple pitch cholesteric layer.

8. The photosensitive element of claim 1 wherein the polymeric multilayer reflector comprises a wide angle multilayer reflector where its layers have a gradation in thickness from one end of the wide angle multilayer reflector to the other.

9. The photosensitive element of claim 8 wherein the wide angle multilayer reflector has thicker layers proximate the photosensitive material.

10. The photosensitive element of claim 1 wherein the polymeric multilayer reflector comprises a narrow band multilayer reflector.

11. The photosensitive element of claim 1 wherein the polymeric multilayer reflector comprises a wide angle multilayer reflector.

12. The photosensitive element of claim 1 wherein the polymeric multilayer reflector comprises alternating layers of material wherein one of the alternating layers is selected from the group consisting of polyethylene naphthalate, polyethylene terephthalate and copolymers thereof.

13. The photosensitive element of claim 1 wherein the polymeric multilayer reflector comprises alternating layers of material wherein one of the alternating layers is selected from the group consisting of polymethylmethacrylate, polyethyl methacrylate, copolymers of polymethylmethacrylate, a blend of polymethylmethacrylate and poly(vinylidene fluoride), polyolefin copolymers, poly(ethylene-co-octene), poly(propylene-co-ethylene), a copolymer of atactic polypropylene and isotactic polypropylene, and linear low density polyethylene-g-maleic anhydride.

14. A photosensitive structure comprising:

a layer of a photosensitive material, which is sensitive to actinic radiation in a selected wavelength region;

a first intermediate film layer bearing the photosensitive material;

a polymeric multilayer reflector bearing the first intermediate film layer;

a light absorbing layer placed on the polymeric multilayer reflector opposite the first intermediate film layer; and a second intermediate film layer juxtaposed between the light absorbing layer and the polymeric multilayer reflector.

15. The photosensitive element of claim 14 wherein the polymeric multilayer reflector reflects at least 50% of actinic radiation in the selected wavelength region.

16. The photosensitive element of claim 14 wherein the photosensitive material is photothermographic.

17. The photosensitive structure of claim 14 wherein the light absorbing layer includes antihalation materials.

18. The photosensitive element of claim 17 wherein the light absorbing layer includes antihalation dye.

19. The photosensitive element of claim 14 wherein the photosensitive material is photographic.

20. The photosensitive element of claim 14 wherein the polymeric multilayer reflector comprises alternating layers of polymers having different indices of refraction.

21. The photosensitive element of claim 20 wherein said alternating layers are isotropic.

22. The photosensitive element of claim 20 wherein at least one of said alternating layers is birefringent.

23. The photosensitive element of claim 14 wherein the polymeric multilayer reflector comprises a cholesteric film.

24. The photosensitive element of claim 23 wherein said cholesteric film comprises a multiple pitch cholesteric layer.

25. The photosensitive structure of claim 14 wherein the polymeric multilayer reflector comprises alternating layers of material wherein one of the alternating layers is selected from the group consisting of polyethylene naphthalate, polyethylene terephthalate and copolymers thereof.

26. The photosensitive structure of claim 14 wherein the polymeric multilayer reflector comprises alternating layers of material wherein one of the alternating layers is selected from the group consisting of polymethylmethacrylate, polyethyl methacrylate, copolymers of polymethylmethacrylate, a blend of polymethylmethacrylate and poly(vinylidene fluoride), polyolefin copolymers, poly(ethylene-co-octene), poly(propylene-co-ethylene), a copolymer of atactic polypropylene and isotactic polypropylene, and linear low density polyethylene-g-maleic anhydride.

27. A photosensitive element comprising:

a layer of a photosensitive material; and a polymeric multilayer reflector bearing the layer of the photosensitive material wherein the polymeric multilayer reflector comprises alternating layers of a first polymer and a second polymer, wherein the layers have thicknesses less than 0.5 micrometers and wherein the first polymer and the second polymer have in-plane indices of refraction that differ by at least 0.03.

28. The photosensitive element of claim 27 further comprising at least one intermediate film layer between the layer of photosensitive material and the polymeric multilayer reflector.

29. The photosensitive element of claim 27 wherein the photosensitive material is photothermographic.

30. The photosensitive element of claim 27 wherein the photosensitive material is photographic.

31. The photosensitive element of claim 27 wherein said alternating layers are isotropic.

32. The photosensitive element of claim 27 wherein at least one of said alternating layers is birefringent.

33. The photosensitive element of claim 27 wherein the polymeric multilayer reflector comprises a cholesteric film.

34. The photosensitive element of claim 33 wherein said cholesteric film comprises a multiple pitch cholesteric layer.

35. The photosensitive element of claim 27 further comprising a light absorbing layer coated onto a surface of the polymeric multilayer reflector opposite the surface bearing the photosensitive layer.

36. The photosensitive element of claim 35 wherein the light absorbing layer includes an antihalation layer.

37. The photosensitive element of claim 27 wherein the polymeric multilayer reflector comprises alternating layers of material wherein one of the alternating layers is selected from the group consisting of polyethylene naphthalate, polyethylene terephthalate and copolymers thereof.

38. The photosensitive element of claim 27 wherein the polymeric multilayer reflector comprises alternating layers of material wherein one of the alternating layers is selected from the group consisting of polymethylmethacrylate, polyethyl methacrylate, copolymers of polymelthylmethacrylate, a blend of polymethylmethacrylate and poly(vinylidene fluoride), polyolefin copolymers, poly(ethylene-co-octene), poly(propylene-co-ethylene), a copolymer of atactic polypropylene and isotactic polypropylene, and linear low density polyethylene-g-maleic anhydride.

39. A photosensitive element comprising:

a photosensitive layer;

a polymeric wide angle multilayer reflector bearing the photosensitive layer;

a first intermediate layer bearing the wide angle multilayer reflector;

a second intermediate film layer; and a polymeric narrow band multilayer reflector affixed between the first intermediate film layer and the second intermediate film layer.

40. The photosensitive element of claim 39 further comprising a light absorbing layer coated onto the bottom of the second intermediate film layer.

41. The photosensitive element of claim 39 wherein the light absorbing layer includes an antihalation layer.

42. The photosensitive element of claim 39 wherein the polymeric wide angle multilayer reflector has a quarter wave stack design, where its layers have a gradation in thickness from one end of the wide angle multilayer reflector to the other.

43. The photosensitive element of claim 39 wherein the polymeric wide angle multilayer reflector has a thickest layer proximate the photosensitive layer.

44. The photosensitive element of claim 39 wherein the polymeric multilayer reflector comprises alternating layers of polyethylene terephthalate and thermoplastic polyester elastomer.

45. The photosensitive element of claim 39 wherein the polymeric wide angle multilayer reflector comprises alternating layers of material wherein one of the alternating layers is selected from the group consisting of polyethylene naphthalate, polyethylene terephthalate and copolymers thereof.

46. The photosensitive element of claim 39 wherein the polymeric wide angle multilayer reflector comprises alternating layers of material wherein one of the alternating layers is selected from the group consisting of polymethylmethacrylate, polyethyl methacrylate, copolymers of polymethylmethacrylate, a blend of polymethylmethacrylate and poly(vinylidene fluoride), polyolefin copolymers, poly(ethylene-co-octene), poly(propylene-co-ethylene), a copolymer of atactic polypropylene and isotactic polypropylene, and linear low density polyethylene-g-maleic anhydride.

47. The photosensitive element of claim 39 wherein the polymeric narrow band multilayer reflector comprises alternating layers of material wherein one of the alternating layers is selected from the group consisting of polyethylene naphthalate, polyethylene terephthalate and copolymers thereof.

48. The photosensitive element of claim 39 wherein the polymeric narrow band multilayer reflector comprises alternating layers of material wherein one of the alternating layers is selected from the group consisting of polymethylmethacrylate, polyethyl methacrylate, copolymers of polymethylmethacrylate, a blend of polymethylmethacrylate and poly(vinylidene fluoride), polyolefin copolymers, poly(ethylene-co-octene), poly(propylene-co-ethylene), a copolymer of atactic polypropylene and isotactic polypropylene, and linear low density polyethylene-g-maleic anhydride.

49. A photosensitive element comprising:

a layer of a photosensitive material sensitive to actinic radiation in a selected wavelength region; and a transparent, multilayer, polymeric support comprising alternating layers of polymers wherein one of the alternating layers is selected from the group consisting of polyethylene naphthalate, polyethylene terephthalate, and copolymers thereof, polymethyl methacrylate, polyethyl methacrylate, copolymers of polymethyl methacrylate, a blend of polymethyl methacrylate and poly(vinylidene fluoride), polyolefin copolymers, poly(ethylene-co-octene), poly (propylene-co-ethylene), a copolymer of atactic polypropylene, and isotactic polypropylene, and linear low density polyethylene-g-maleic anhydride.

50. The photosensitive element of claim 49 wherein the transparent, multilayer, polymeric support reflects at least 50% of actinic radiation in the range of wavelengths to which the photosensitive material is sensitive.

51. A photosensitive element comprising:

a layer of a photosensitive material, which is sensitive to actinic radiation in a selected wavelength region;

a first intermediate film layer bearing the photosensitive material; and a transparent, multilayer, polymeric support.

52. The photosensitive element of claim 51 further comprising a light absorbing layer placed on the transparent, multilayer, polymeric support opposite the first intermediate film layer.

53. The photosensitive element of claim 52 further comprising a second intermediate film layer juxtaposed between the light absorbing layer and the transparent, multilayer, polymeric support.

54. The photosensitive element of claim 52 wherein the light absorbing layer includes antihalation materials.

55. The photosensitive element of claim 52 wherein the light absorbing layer includes antihalation dye.

56. The photosensitive element of claim 51 wherein the photosensitive material is photographic.

57. The photosensitive element of claim 51 wherein the polymeric multilayer support comprises alternating layers of material wherein one of the alternating layers is selected from the group consisting of polyethylene naphthalate, polyethylene terephthalate, and copolymers thereof.

58. The photosensitive element of claim 51 wherein the polymeric multilayer support comprises alternating layers of material wherein one of the alternating layers is selected from the group consisting of polymethylmethacrylate, polyethyl methacrylate, copolymers of polymethyl methacrylate, a blend of polymethyl methacrylate and poly(vinylidene fluoride), polyolefin copolymers, poly(ethylene-co-octene), poly(propylene-co-ethylene), a copolymer of atactic polypropylene and isotactic polypropylene, and linear low density polyethylene-g-maleic anhydride.

* * * * *